United States Patent
Takeya

(10) Patent No.: US 9,263,567 B2
(45) Date of Patent: Feb. 16, 2016

(54) NITRIDE HIGH ELECTRON MOBILITY TRANSISTOR HAVING A CHANNEL FORMING STACK

(71) Applicant: Seoul Semiconductor Co., Ltd., Ansan-si (KR)

(72) Inventor: Motonobu Takeya, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/275,276

(22) Filed: May 12, 2014

(65) Prior Publication Data
US 2014/0332822 A1    Nov. 13, 2014

(30) Foreign Application Priority Data
May 10, 2013   (KR) .................. 10-2013-0053444

(51) Int. Cl.
*H01L 29/66*   (2006.01)
*H01L 29/778*  (2006.01)
*H01L 29/20*   (2006.01)

(52) U.S. Cl.
CPC ........ *H01L 29/7787* (2013.01); *H01L 29/2003* (2013.01); *H01L 29/66431* (2013.01)

(58) Field of Classification Search
CPC .................. H01L 29/7787; H01L 29/66431; H01L 29/2003
See application file for complete search history.

(56) References Cited

U.S. PATENT DOCUMENTS

| | | | |
|---|---|---|---|
| 2004/0061129 A1* | 4/2004 | Saxler ................. | H01L 29/7787 257/192 |
| 2008/0073652 A1* | 3/2008 | Sugimoto ......... | H01L 29/66462 257/76 |
| 2010/0084687 A1* | 4/2010 | Chen ................... | H01L 29/207 257/194 |
| 2013/0015498 A1* | 1/2013 | Briere .................... | 257/191 |

* cited by examiner

*Primary Examiner* — Bilkis Jahan
(74) *Attorney, Agent, or Firm* — H.C. Park & Associates, PLC

(57) ABSTRACT

A normally off nitride-based transistor may include a source electrode and a drain electrode, a channel layer serving as a charge transfer path between the source electrode and the drain electrode, and a gate electrode that controls charge transfer of the channel layer. The channel layer may have a junction structure of a first conductive nitride semiconductor layer and an intrinsic nitride semiconductor layer such that a fixed turn-off blocking electric field is generated in the channel layer between the source electrode and the drain electrode in a turn-off state. The intrinsic nitride semiconductor layer may include an intrinsic GaN semiconductor layer, and the first conductive nitride semiconductor layer may include a p type GaN semiconductor layer stacked over the intrinsic GaN semiconductor layer.

15 Claims, 16 Drawing Sheets

NITRIDE HIGH ELECTRON MOBILITY TRANSISTOR HAVING A CHANNEL FORMING STACK

CROSS-REFERENCE TO RELATED APPLICATION

This application claims priority from and the benefit of Korean Patent Application No. 10-2013-0053444, filed on May 10, 2013, which is hereby incorporated by reference for all purposes as if fully set forth herein.

BACKGROUND OF THE INVENTION

1. Field

Exemplary embodiments of the present invention relate to a normally off transistor and a method of fabricating the same, and more particularly, to a normally off nitride-based transistor using a nitride-based semiconductor and a method of fabricating the same.

2. Discussion of the Background

Recently, AlGaN/GaN HEMT (High Electron Mobility Transistor), which is one of GaN-based electronic devices, has power density of about 4 W/mm to 8 W/mm, and maximum output power of a single chip is about 90 W in 3 GHz. Since the GaN electronic device has high power density and efficiency as compared with the existing GaAs electronic device, it is advantageous in that it is possible to reduce a module size to about 50% or more and achieve lightness.

However, since the GaN electronic device is very expensive and a mass production process of a high output device of 25 W or more has not been completed, it is difficult to satisfy a large order. In order to lower the cost of the GaN electronic device, when an AlGaN/GaN stack structure is formed in an inexpensive substrate such as a sapphire substrate or a silicon substrate instead of an expensive GaN substrate, since threading dislocation density is high, it is not reliable.

A normally off characteristic is required for a GaN transistor device in relation to a switching characteristic, and when a conventional horizontal AlGaN/GaN HEMT has the normally off characteristic, since a threshold voltage characteristic is degraded or process control is difficult, reproducibility and reliability are reduced. When the threshold voltage characteristic is degraded, an electronic device may abnormally operate in a high temperature operation or a noise environment.

For example, in a recess gate type horizontal normally off GaN HEMT, the thickness of an AlGaN layer below a trench, in which a recess gate is installed, should be controlled to about several nm (for example, 1 nm to 5 nm) in an etch process, but it is difficult to strictly manage an etch depth in such an etch process, resulting in the deterioration of productivity.

In another example, in a p-GaN gate type horizontal normally off GaN HEMT, a p-GaN layer is disposed under a gate electrode, so that a potential well of a valence band existing around an interface of AlGaN/GaN heterojunction layers under the gate electrode moves above the Fermi level, and thus a discontinuous region with no two dimensional electron gas (2DEG) is formed in a 2DEG channel, resulting in the achievement of a normally off characteristic. However, since a threshold voltage of the conventional GaN HEMT is reduced due to the characteristic of the p-GaN layer itself, there is a limitation in utilizing the normally off characteristic.

In a dry etch process for forming a p-GaN gate, since positive charge is accumulated on the surface of the AlGaN layer due to plasma damage, a current collapse phenomenon is accelerated, so that a 2DEG characteristic is degraded.

In addition, the aforementioned recess gate type or p-GaN gate type horizontal normally off GaN HEMT has the following problems due to electric field concentration at an edge of the gate electrode and high threading dislocation density.

First, when a plurality of pits or cracks exist in the AlGaN/GaN layer, mechanical stress is easily accumulated in the AlGaN layer.

Then, in an AlGaN barrier layer for forming the AlGaN/GaN heterojunction, the AlGaN barrier layer is damaged step by step due to an inverse Piezoelectric effect in which electrical energy is converted into mechanical energy through a permanent dipole generated by asymmetry of crystallization. In this case, there is a problem that maximum current, which may flow through the device, is reduced and leakage increases.

Last, as the strength of voltage applied to the normally off GaN HEMT is increased or the accumulation of use time, a part having dislocation or defect is quickly expanded, so that the performance of the device easily deteriorates. Particularly, when the threading dislocation density increases to about $10^8/cm^2$ to about $10^{10}/cm^2$, since an on-resistance rise rate is high in a high temperature operation, breakdown voltage is lowered and leakage increases.

SUMMARY OF THE INVENTION

An object of a normally off nitride-based transistor and a method of fabricating the same according to the present invention is to prevent an electric field from being concentrated at an edge of a gate electrode and to avoid a high threading dislocation density region, thereby preventing the reduction of breakdown voltage.

Another object of a normally off nitride-based transistor and a method of fabricating the same according to the present invention is to prevent maximum current reduction and leakage and prevent an on-resistance rise rate from increasing in a high temperature operation.

Yet another object of a normally off nitride-based transistor and a method of fabricating the same according to the present invention is to allow a turn-off blocking electric field formed in a channel region to be constant, thereby preventing leakage current.

In accordance with one aspect of the present invention, a normally off nitride-based transistor may include: a source electrode and a drain electrode; a channel layer serving as a charge transfer path between the source electrode and the drain electrode; and a gate electrode that controls charge transfer of the channel layer, wherein: the channel layer has a junction structure of a first conductive nitride semiconductor layer and an intrinsic nitride semiconductor layer such that a fixed turn-off blocking electric field is generated in the channel layer between the source electrode and the drain electrode in a turn-off state.

The intrinsic nitride semiconductor layer may include an intrinsic GaN semiconductor layer, and the first conductive nitride semiconductor layer may include a p type GaN semiconductor layer stacked over the intrinsic GaN semiconductor layer.

A nucleation layer may be formed in regions under the source electrode and the drain electrode to cause TD concentration.

In accordance with another aspect of the present invention, a normally off nitride-based transistor may include: a channel forming stack having a junction structure of a first conductive nitride semiconductor layer and an intrinsic nitride semiconductor layer such that a fixed turn-off blocking electric field is generated in a channel; a switch semiconductor layer formed in a partial region on the channel forming stack; a gate dielectric layer and a gate electrode formed in a partial region on the switch semiconductor layer; a source electrode formed in another partial region on the switch semiconductor layer; and a drain electrode formed in another partial region on the channel forming stack.

The normally off nitride-based transistor may further include a nucleation layer causing cause TD concentration and a high resistance nitride-based semiconductor buffer layer under the channel forming stack.

The switch semiconductor layer may include: a first conductive first semiconductor layer formed over the channel forming stack; a second conductive second semiconductor layer formed over the first semiconductor layer; and a first conductive third semiconductor layer formed over the second semiconductor layer, wherein an inclined plane may be formed from the third semiconductor layer to the first semiconductor layer.

The normally off nitride-based transistor may further include a vertical conductive layer formed in a lateral region, in which the inclined plane is low, of the gate electrode.

The switch semiconductor layer may include: a first conductive nitride semiconductor layer formed over the channel forming stack; an intrinsic nitride semiconductor layer formed over the first conductive nitride semiconductor layer; an aluminum nitride semiconductor layer formed over the intrinsic nitride semiconductor layer, wherein a recess structure may be formed in the first conductive nitride semiconductor layer and the intrinsic nitride semiconductor layer.

The normally off nitride-based transistor may further include an activation hole formed in the switch semiconductor layer or the channel forming stack with no switch semiconductor layer.

The intrinsic nitride semiconductor layer may include an intrinsic GaN semiconductor layer, and the first conductive nitride semiconductor layer may include a p type GaN semiconductor layer stacked over the intrinsic GaN semiconductor layer The channel forming stack may include at least one of the intrinsic GaN semiconductor layer and a structure of the p type GaN semiconductor layer stacked over the intrinsic GaN semiconductor layer.

The channel forming stack is a structure for forming a 2DEG channel and may include: an i-GaN semiconductor layer; and an AlGaN semiconductor layer stacked over the i-GaN semiconductor layer.

The channel forming stack may include at least one of the i-GaN semiconductor layer and a structure of the AlGaN semiconductor layer stacked over the i-GaN semiconductor layer.

In accordance with further another aspect of the present invention, a method of fabricating a normally off nitride-based transistor may include: a step of growing a high resistance nitride-based semiconductor buffer layer on a substrate; a step of growing a channel forming stack over the buffer layer, the channel forming stack having a junction structure of a first conductive nitride semiconductor layer and an intrinsic nitride semiconductor layer such that a fixed turn-off blocking electric field is generated; a step of forming a switch semiconductor layer over the channel forming stack; a step of forming a gate electrode over the switch semiconductor layer; and a step of forming a source electrode and a drain electrode.

The step of forming the switch semiconductor layer may include: a step of forming a first conductive first semiconductor layer over the channel forming stack; a step of forming a second conductive second semiconductor layer over the first semiconductor layer; a step of forming a first conductive third semiconductor layer over the second semiconductor layer; and a step of forming an inclined plane from the third semiconductor layer to the first semiconductor layer, wherein: the step of forming the gate electrode may include: a step of forming a gate dielectric layer over the inclined plane; and a step of forming a gate electrode over the gate dielectric layer.

The step of forming the switch semiconductor layer may include: a step of forming a first conductive nitride semiconductor layer over the channel forming stack; a step of forming an intrinsic nitride semiconductor layer over the first conductive nitride semiconductor layer; a step of forming an aluminum nitride semiconductor layer over the intrinsic nitride semiconductor layer; and a step of forming a recess structure in the first conductive nitride semiconductor layer and the intrinsic nitride semiconductor layer, wherein: the step of forming the gate electrode may include: a step of forming a gate dielectric layer over the recess structure; and a step of forming a gate electrode over the gate dielectric layer.

The source electrode may be formed over the switch semiconductor layer, and the drain electrode may be formed over the channel forming stack with no switch semiconductor layer.

The method may further include a step of forming an activation hole in the switch semiconductor layer or the channel forming stack with no switch semiconductor layer.

The step of growing the channel forming stack may include: a step of stacking an intrinsic GaN semiconductor layer; and a step of stacking a p type GaN semiconductor layer over the intrinsic GaN semiconductor layer.

In the step of growing the channel forming stack, the step of stacking the intrinsic GaN semiconductor layer and the step of stacking the p type GaN semiconductor layer on the intrinsic GaN semiconductor layer may be repeated at least one time.

The step of growing the channel forming stack may include: a step of stacking an i-GaN semiconductor layer such that a 2DEG channel is formed; and a step of stacking an AlGaN semiconductor layer over the i-GaN semiconductor layer.

In the step of growing the channel forming stack, the step of stacking the i-GaN semiconductor layer and the step of stacking the AlGaN semiconductor layer over the i-GaN semiconductor layer may be repeated at least one time Before the switch semiconductor layer is formed, a buffer layer may be formed over a layer in which the 2DEG channel is formed.

The step of growing the channel forming stack may include a step of forming a nucleation layer in regions under the source electrode and the drain electrode on the grown substrate.

A vertical conductive layer may be formed in a lateral region, in which the inclined plane is low, of the gate electrode.

In accordance with the normally off nitride-based transistor and the method of fabricating the same according to the present invention as described above, an electric field is prevented from being concentrated at an edge of a gate electrode and a high threading dislocation density region is avoided to prevent the reduction of breakdown voltage, thereby providing an effect of ensuring reliability.

In accordance with the normally off nitride-based transistor and the method of fabricating the same according to an embodiment of the present invention, maximum current reduction and leakage are prevented and an on-resistance rise rate is prevented from increasing in a high temperature operation, thereby providing an effect of improving reliability as compared with the conventional art.

In accordance with the normally off nitride-based transistor and the method of fabricating the same according to another embodiment of the present invention, a turn-off blocking electric field generated in a channel region is allowed to be constant, thereby providing an effect of preventing leakage current in addition to the aforementioned effect.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE ILLUSTRATED EMBODIMENTS

Figure 1:
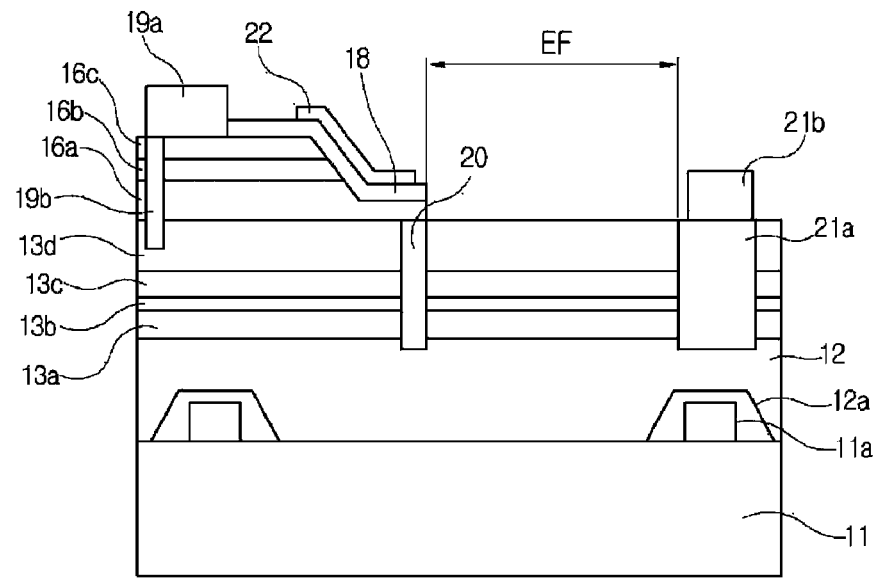
FIG. 1 is a cross-sectional view of a normally off nitride-based transistor (hereinafter, referred to a nitride-based transistor) in accordance with an embodiment of the present invention.

Terms or words used hereinafter should not be construed as having common or dictionary meanings, but should be construed as having meanings and concepts that comply with the technical spirit of the present invention on the basis of the principle that the inventor may appropriately define the concepts of the terms in order to best describe his or her invention. Accordingly, the following description and drawings illustrate exemplary embodiments of the present invention and do not fully represent the scope of the present invention. It would be understood by one of ordinary skill in the art that a variety of equivalents and modifications of the embodiments exist.

Embodiments of the present invention are described in detail below with reference to the accompanying drawings.

In the drawings, the width, length, thickness, etc. of each element may have been enlarged for convenience. Furthermore, when it is described that one element is disposed 'over' or 'on' the other element, one element may be disposed 'right over' or 'right on' the other element or a third element may be disposed between the two elements. The same reference numbers are used throughout the specification to refer to the same or like parts.

FIG. 1 is a cross-sectional view of a nitride-based transistor in accordance with an embodiment of the present invention.

Referring to FIG. 1, the nitride-based transistor includes a substrate 11, a nucleation layer 12a, a high resistance GaN buffer layer 12, channel forming stacks 13a, 13b, 13c, and 13d, a first switch region semiconductor layer (hereinafter, referred to a first semiconductor layer) 16a, a second switch region semiconductor layer (hereinafter, referred to a second semiconductor layer) 16b, a third switch region semiconductor layer (hereinafter, referred to a third semiconductor layer) 16c, a gate dielectric layer 18, source electrodes 19a and 19b, a vertical conductive layer 20, drain electrodes 21a and 21b, and a gate electrode 22.

The substrate 11 may include a growth substrate such as sapphire substrate, an AlN substrate, a GaN substrate, a SiC substrate, or a Si substrate, and is not specially limited to any substrate if a nitride-based semiconductor can be grown on the substrate. In the following description, the substrate 11 is assumed to be a c-plane (0001) sapphire substrate for the purpose of convenience.

The substrate 11 is provided on the upper surface thereof with a convex stripe pattern 11a. The cross-section of the pattern 11a may have a mesa structure. Due to such a substrate 11, in a stack structure of epitaxial growth layers on the substrate, threading dislocation (TD) is concentrated on a desired part, that is, the upper portion of the pattern 11a.

The nucleation layer 12a is a low temperature GaN layer epitaxially grown on the substrate 11 about the pattern 11a of the substrate 11.

The high resistance GaN buffer layer 12 is for planarization of the epitaxially growth layers on the substrate 11 and preventing electrons from escaping from an upper multi-2DEG channel layer (a drift layer). The high resistance GaN buffer layer 12 contains electron-trapping impurity, such as Fe or C, which is doped with the concentration of about $5\times10^{17}/cm^2$ to about $1\times10^{19}/cm^2$, and has a thickness of about 0.01 μm or more and about 2 μm or less.

The high resistance GaN buffer layer 12 is generated from the nucleation layer 12a by epitaxial lateral overgrowth. According to such a growth method, the high resistance GaN buffer layer 12 is vertically formed at a part at which the nucleation layer 12a is disposed and threading dislocation is vertically transferred, but the high resistance GaN buffer layer 12 is horizontally formed at a part at which the nucleation layer 12a is not disposed and the threading dislocation is not vertically transferred, so that threading dislocation density of the corresponding part is relatively lowered.

The channel forming stacks 13a, 13b, 13c, and 13d include a first i-GaN semiconductor layer 13a, an AlGaN semiconductor layer 13b, a second i-GaN semiconductor layer 13c, and a p type GaN semiconductor layer 13d, and serve as a drift layer (a channel layer) that drifts electrons according to a voltage difference between the source electrodes 19a and 19b and the drain electrodes 21a and 2b.

The first i-GaN semiconductor layer 13a includes an intrinsic GaN semiconductor and has a thickness of about 0.01 μm or more and about 1.0 μm or less. The second i-GaN semiconductor layer 13c may include a c-plane growth intrinsic GaN semiconductor and have a thickness of about 0.01 μm or more and about 1.0 μm or less.

The AlGaN layer 13b may have an aluminum (Al) composition ratio of 10% to 100% and may be formed to have a thickness of about 10 nm or more and about 50 nm or less.

The p type GaN semiconductor layer 13d may be formed to have a p type by doping Mg or Zn, and may have a thickness of about 0.02 µm or more and about 2.0 µm or less, which is thicker than that of the second i-GaN semiconductor layer 13c.

When the first and second i-GaN semiconductor layers 13a and 13c are used, since continuous growth is simply performed from upper and lower layer materials and process control of impurity doping concentration and the like is not required, it is advantageous in that it is possible to simplify a fabrication process. When such an advantage is reduced or is not considered, the first and second i-GaN semiconductor layers 13a and 13c may be made of a binary system nitride-based semiconductor such as InN, a ternary system nitride-based semiconductor such as AlGaN or InGaN, or a quaternary system nitride-based semiconductor such as AlInGaN, in addition to the GaN semiconductor.

The first semiconductor layer 16a, the second semiconductor layer 16b, and the third semiconductor layer 16c form an npn stack structure for forming a switch region of the transistor. The first semiconductor layer 16a and the third semiconductor layer 16c include a first conductive semiconductor layer such as an n type GaN layer, and the second semiconductor layer 16b includes a second conductive semiconductor layer such as a p type GaN layer.

In the present embodiment, the npn stack structure includes an inclined plane that is disposed in source regions in which the source electrodes 19a and 19b are to be formed and a gate region in which the gate electrode is to be formed, and is formed at one side of the npn stack structure in the gate region. Due to such an inclined plane structure, a gate length in the horizontal direction in the transistor structure can be reduced to miniaturize an apparatus. Furthermore, since the vertically formed npn stack structure is exposed on the inclined plane, a separate trench forming process for forming the gate electrode 22 is not required.

Furthermore, the npn stack structure is disposed in first regions in which threading dislocation density (TDD) is high. In the present embodiment, the TDD of the first region is averagely about $1 \times 10^8/cm^2$ to about $1 \times 10^9/cm^2$, and the TDD of a second region disposed between the first regions and having a TDD lower than that of the first region is averagely about $1 \times 10^6/cm^2$. Since the first region with high TDD is disposed under the npn stack structure, a channel between the gate electrode 22 and the drain electrode 21 has low TDD distribution, so that leakage current can be reduced and a pressure-resistant characteristic can be enhanced. Even though leakage current is generated in the first region with high TDD, the leakage current can be blocked by high resistance of the high resistance GaN buffer layer 12.

The gate dielectric layer 18 is disposed on the npn stack structure, that is, on the inclined plane of the npn stack structure. The gate dielectric layer 18 is made of insulating material such as an $Al_2O_3$ insulating layer, an $Al_2O_3/HfO_2$ stack insulating layer, a silicon oxide layer, or a silicon nitride layer, and has a thickness of about 1.3 nm or more.

The source electrodes 19a and 19b may have a structure in which a partial region 19d is extended to the p type GaN semiconductor layer 13d or may have a straight rod shape, and the drain electrodes 21a and 21b may have a straight rod shape.

The inclined plane for the npn stack structure of the first semiconductor layer 16a, the second semiconductor layer 16b, and the third semiconductor layer 16c is provided on the device surface between the source electrodes 19a and 19b and the drain electrodes 21a and 21b, and the drift layer including the channel forming stacks 13a, 13b, 13c, and 13d is disposed between the inclined plane and the drain electrodes 21a and 21b.

The source electrodes 19a and 19b are made of Ni, Al, Ti, and Au, which make ohmic contact with the third semiconductor layer 16c or a combination thereof. The drain electrode 21 includes the drain electrode body 21b made of Ni, Al, Ti, and Au, which make ohmic contact with the i-GaN semiconductor layer 13 or a combination thereof, and the drain electrode core 21a made of n type GaN.

The drain electrode core 21a illustrated in FIG. 1 is formed to have a thickness equal to or more than those of the channel forming stacks 13a, 13b, 13c, and 13d and is connected to the high resistance GaN buffer layer 12. However, the present invention is not limited thereto, and the drain electrode core 21a may be formed on the channel forming stacks 13a, 13b, 13c, and 13d and may be formed to have a thickness equal or less than those of the channel forming stacks 13a, 13b, 13c, and 13d.

Referring to FIG. 1, a lower portion of the drain electrode 21 may also have high TDD distribution. Since the high TDD under the drain electrode 21 has no influence on a channel and an interconnection connected to the drain electrode 21 has resistance very lower than that of the high resistance GaN buffer layer 12, device characteristic deterioration due to leakage current to the lower portion of the drain electrode 21 rarely occurs.

The gate electrode 22 is formed on the inclined plane provided at one side of the npn stack structure. That is, the gate electrode 22 is formed on the inclined plane of the stack structure of the first to third semiconductor layers 16a, 16b, and 16c while interposing the gate dielectric layer 18. The gate electrode 22 is made of material such as Ti or Au.

The vertical conductive layer 20 may be disposed in a plate shape upright in the vertical direction to pass through the channel forming stacks 13a, 13b, 13c, and 13d in the device thickness direction or the vertical direction between the drain electrode 21 and the gate electrode 22. In this case, the vertical conductive layer 20 is disposed to face the drain electrode 21 in a face-to-face manner while interposing the channel forming stacks 13a, 13b, 13c, and 13d between the vertical conductive layer 20 and the drain electrode 21. Preferably, the vertical conductive layer 20 is disposed at a center of two nucleation layers 12a. As illustrated in FIG. 1, the high resistance GaN buffer layers 12 epitaxially laterally overgrown between the two nucleation layers 12a meet at the center and are combined with each other, and in this region, threading dislocation may occur. Accordingly, when the vertical conductive layer 20 is disposed in a coalescent region, leakage current due to threading dislocation occurring in the coalescent region is reduced. The vertical conductive layer 20 may be made of single metal material such as Au or multiple metal material such as Al/Ti or Ni/Au, which makes low resistance ohmic contact with the GaN semiconductor.

In accordance with the present exemplary embodiment, the source electrodes are disposed on the n-p-n stack structure of the source region side with high TDD and the drain electrodes are disposed on the channel forming stacks 13a, 13b, 13c, and 13d of the drain region side with high TDD, so that an electric field can be prevented from being concentrated on a gate edge together with miniaturization of the transistor, and the TDD of the drift layer can be reduced, thereby providing a nitride-based transistor with low leakage and improved on-resistance. FIG. 1 illustrates that the high TDD is disposed at the lower portion of the n-p-n stack structure of the source region side and the lower portion of the drain electrode 21. However, the present invention is not limited thereto, and when an interval between the nucleation layers 12a is widened, the high TDD may be disposed at only one of the lower portion of the n-p-n stack structure and the lower portion of the drain electrode 21.

An operation of the nitride-based transistor according to the present embodiment will be described.

When voltage equal to or more than forward threshold voltage is not applied to the gate electrode 22, that is, when the gate electrode is opened, an inverted layer is not formed on an inclined boundary surface of the second semiconductor layer 16*b* facing the gate electrode 22 in the npn stack structure and a channel is not formed between the third semiconductor layer 16*c* and the first semiconductor layer 16*a*, so that the transistor enters a non-activated or turn-off state in which no current flows. At this time, since the gate part and the channel part are separated from each other by the relatively thick pGaN semiconductor layer 13*d*, it is possible to reduce leakage current between the source electrode and the drain electrode of the surface side, and a relatively wide depletion region formed on the boundary between the C-plane grown second i-GaN semiconductor layer 13*c* and the p type GaN semiconductor layer 13*d* stably maintains a turn-off blocking electric field (EF) between the source electrode and the drain electrode. The turn-off blocking electric field can effectively prevent leakage current in a normally off state or a reverse bias state, and to achieve high breakdown voltage.

When the voltage equal to or more than the forward threshold voltage is applied to the gate electrode 22, the inverted layer is formed on the inclined boundary surface of the second semiconductor layer 16*b* of the npn stack structure and the channel is formed between the third semiconductor layer 16*c* and the first semiconductor layer 16*a*, so that the transistor enters an activated or turn-on state in which current flows.

In the turn-on state of the transistor, electrons, which are supplied from the source electrodes 19*a* and 19*b* to the third semiconductor layer 16*c* of the npn stack structure, transfer toward the first semiconductor layer 16*a* through the channel around the inclined boundary surface of the second semiconductor layer 16*b* according to the voltage difference between the source electrodes 19*a* and 19*b* and the drain electrodes 21*a* and 21*b*, and transfer toward the drain electrodes 21*a* and 21*b* from the first semiconductor layer 16*a* through the channel formed in the channel forming stacks 13*a*, 13*b*, 13*c*, and 13*d*. Through the transfer of the electrons, drain current flows through the drain electrodes 21*a* and 21*b*. At this time, the 2DEG channel formed by the first i-GaN semiconductor layer 13*a* and the AlGaN semiconductor layer 13*b* enables high electron transfer. In a transfer path of the electrons, since the TDD is low, device characteristics due to leakage current do not deteriorate.

Figure 2:
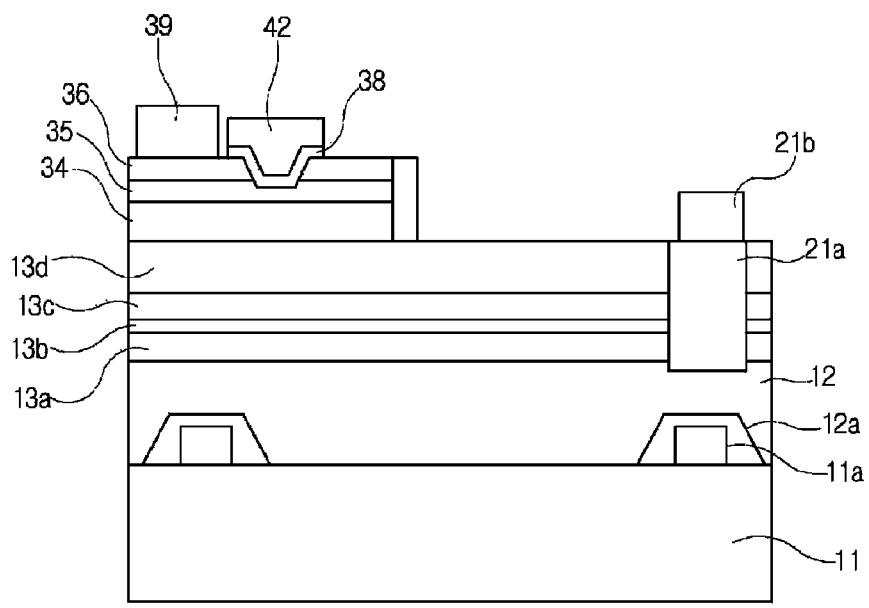
FIG. 2 is a cross-sectional view of a nitride-based transistor in accordance with another embodiment of the present invention.

FIG. 2 is a cross-sectional view of a nitride-based transistor in accordance with another embodiment of the present invention.

Referring to FIG. 2, the nitride-based transistor includes a substrate 11, a high resistance GaN buffer layer 12, channel forming stacks 13*a*, 13*b*, 13*c*, and 13*d*, a p type GaN semiconductor layer 34 as a first switch region semiconductor layer, an i-GaN semiconductor layer 35 as a second switch region semiconductor layer, an AlGaN semiconductor layer 36 as a third switch region semiconductor layer, a gate dielectric layer 38, a source electrode 39, a drain electrode 21*a* and 21*b*, and a gate electrode 42.

The p type GaN semiconductor layer 34 may be formed to have a p type by doping Mg or Zn, and may have a thickness of about 1.0 µm or more and about 2.0 µm or less. In another implementation, instead of the p type GaN semiconductor layer 34, an intrinsic GaN buffer semiconductor layer may be disposed at the same position.

The i-GaN semiconductor layer 35 includes an intrinsic GaN semiconductor and has a thickness of about 0.01 µm or more and about 0.2 µm or less.

The AlGaN layer 36 has an aluminum (Al) composition ratio of 10% to 100% and is formed to have a thickness of about 10 nm or more and about 50 nm or less.

The gate dielectric layer 38 is disposed in a recess obtained by cutting the AlGaN semiconductor layer 36 and the i-GaN semiconductor layer 35 in a recessed shape. The gate dielectric layer 38 is made of insulating material such as an $Al_2O_3$ insulating layer, an $Al_2O_3/HfO_2$ stack insulating layer, a silicon oxide layer, or a silicon nitride layer, and has a thickness of about 1.3 nm or more The gate electrode 42 is formed on the recess while interposing the gate dielectric layer 38. The gate electrode 42 is made of material such as Ti or Au. The source electrode 39 may be made of generally used metal material or conductive semiconductor material.

When voltage equal to or more than forward threshold voltage is applied to the gate electrode 42, a channel is formed around the i-GaN semiconductor layer 35, so that the transistor enters an activated or turn-on state in which current flows.

Since the nitride-based transistor of the present embodiment is similar to the nitride-based transistor of FIG. 1 except that the switch region semiconductor layer has a recess structure, a description thereof will be partially omitted in order to avoid redundancy.

Figure 3:
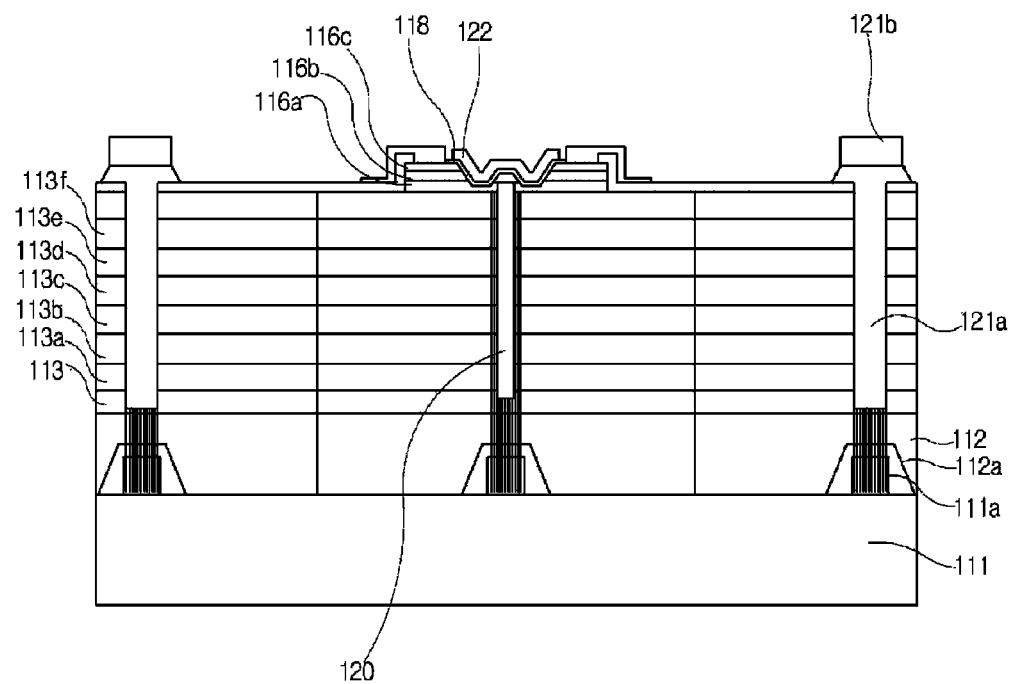
FIG. 3 is a cross-sectional view of a nitride-based transistor in accordance with further another embodiment of the present invention.

FIG. 3 is a cross-sectional view of a nitride-based transistor in accordance with further another embodiment of the present invention.

Referring to FIG. 3, the nitride-based transistor includes a substrate 111, a nucleation layer 112*a*, a first high resistance GaN buffer layer 112, channel forming stacks 113, 113*a*, 113*b*, 113*c*, 113*d*, 113*e*, and 113*f*, a second high resistance GaN buffer layer 115, a first semiconductor layer 116*a*, a second semiconductor layer 116*b*, a third semiconductor layer 116*c*, an activation hole 117, a gate dielectric layer 118, source electrodes 119*a* and 119*b*, drain electrodes 121*a* and 121*b*, and a gate electrode 122.

Since the nitride-based transistor of the present embodiment is similar to the nitride-based transistor of FIG. 1 except for the channel forming stacks 113*a*, 113*b*, 113*c*, 113*d*, 113*e*, and 113*f*, a description thereof will be partially omitted in order to avoid redundancy.

The substrate 111 may include a growth substrate such as sapphire substrate, an AlN substrate, a GaN substrate, a SiC substrate, or a Si substrate, and is not specially limited to any substrate if a nitride-based semiconductor can be grown on the substrate. In the following description, the substrate 111 is assumed to be a c-plane (0001) sapphire substrate for the purpose of convenience.

The substrate 111 is provided on the upper surface thereof with a convex stripe pattern 111*a*. The cross-section of the pattern 111*a* may have a mesa structure. Due to such a substrate 111, in a stack structure of epitaxial growth layers on the substrate, threading dislocation (TD) is concentrated on a desired part, that is, the upper portion of the pattern 111*a*.

The nucleation layer 112*a* is a low temperature GaN layer epitaxially grown on the substrate 111 about the pattern 111*a* of the substrate 111.

The second high resistance GaN buffer layer 115 is for planarization of the epitaxially growth layers on the substrate 111 and preventing electrons from escaping from an upper multi-2DEG channel layer (a drift layer). The first and second high resistance GaN buffer layers 112 and 115 contain electron-trapping impurity, such as Fe or C, which is doped with the concentration of about $5\times10^{17}$/cm$^2$ to about $1\times10^{19}$/cm$^2$, and has a thickness of about 0.01 μm or more and about 2 μm or less.

The channel forming stacks 113a, 113b, 113c, 113d, 113e, and 113f include a base p type GaN semiconductor layer 113, a first i-GaN semiconductor layer 113a, a first p type GaN semiconductor layer 113b, a second i-GaN semiconductor layer 113c, a second p type GaN semiconductor layer 113d, a third i-GaN semiconductor layer 113e, and a third p type GaN semiconductor layer 113f, and serve as a drift layer (a channel layer) that drifts electrons according to a voltage difference between the source electrodes 119a and 119b and the drain electrodes 121a and 121b.

The i-GaN semiconductor layers 113a, 113c, and 113e include a c-plane growth intrinsic GaN semiconductor and has a thickness of about 0.01 μm or more and about 1.0 μm or less.

The p type GaN semiconductor layers 113, 113b, 113d, and 113f may be formed to have a p type by doping Mg or Zn, and may have a thickness of about 0.02 μm or more and about 2.0 μm or less, which is thicker than those of the i-GaN semiconductor layers 113a, 113c, and 113e.

When the i-GaN semiconductor layers 113a, 113c, and 113e are used, since continuous growth is simply performed from upper and lower layer materials and process control of impurity doping concentration and the like is not required, it is advantageous in that it is possible to simplify a fabrication process. When such an advantage is reduced or is not considered, the i-GaN semiconductor layers 113a, 113c, and 113e may be made of a binary system nitride-based semiconductor such as InN, a ternary system nitride-based semiconductor such as AlGaN or InGaN, or a quaternary system nitride-based semiconductor such as AlInGaN, in addition to the GaN semiconductor.

The first semiconductor layer 116a, the second semiconductor layer 116b, and the third semiconductor layer 116c form an npn stack structure for forming a switch region of the transistor. The first semiconductor layer 116a and the third semiconductor layer 116c include a first conductive semiconductor layer such as an n type GaN layer, and the second semiconductor layer 116b includes a second conductive semiconductor layer such as a p type GaN layer.

In the present embodiment, the npn stack structure includes an inclined plane that is disposed in source regions in which the source electrodes 119a and 119b are to be formed and a gate region in which the gate electrode is to be formed, and is formed at one side of the npn stack structure in the gate region. Due to such an inclined structure, a gate length in the horizontal direction in the transistor structure can be reduced to miniaturize an apparatus.

Furthermore, the npn stack structure is disposed in first regions in which threading dislocation density (TDD) is high. In the present embodiment, the TDD of the first region is averagely about $1\times10^8$/cm$^2$ to about $1\times10^9$/cm$^2$, and the TDD of a second region disposed between the first regions and having a TDD lower than that of the first region is averagely about $1\times10^6$/cm$^2$.

The activation hole 117 is for activating magnesium included in the second semiconductor layer 116b of the npn stack structure in a heat treatment process, and may have a cavity shape in which the third semiconductor layer 116c and a half portion of the second semiconductor layer 116b have been vertically removed, or a shape in which predetermined insulating material (gate dielectric layer material) has been filled in the cavity.

The gate dielectric layer 118 is disposed on the npn stack structure, that is, on the inclined plane of the npn stack structure. The gate dielectric layer 118 is made of insulating material such as an Al$_2$O$_3$ insulating layer, an Al$_2$O$_3$/HfO$_2$ stack insulating layer, a silicon oxide layer, or a silicon nitride layer, and has a thickness of about 1.3 nm or more.

The source electrodes 119a and 119b are disposed on the npn stack structure with relatively high TDD. The drain electrode includes the drain electrode core 121a and the drain electrode body 121b, wherein the drain electrode core 121a is disposed on the channel forming stacks 113, 113a, 113b, 113c, 113d, 113e, and 113f with relatively high TDD. The source electrodes 119a and 119b may include the source electrode core 119a in which a partial region is extended to the second high resistance GaN buffer layer 115 and the source electrode body 119b connected to the source electrode core 119a, and the drain electrode core 121a may have a straight rod shape.

The inclined plane for the npn stack structure of the first semiconductor layer 116a, the second semiconductor layer 116b, and the third semiconductor layer 116c is provided on the device surface between the source electrode 119 and the drain electrodes 121a and 121b, and the drift layer including the channel forming stacks 113, 113a, 113b, 113c, 113d, 113e, and 113f is disposed between the inclined plane and the drain electrodes 121a and 121b.

The source electrode 119 is made of Ni, Al, Ti, and Au, which make ohmic contact with the third semiconductor layer 116c or a combination thereof. The drain electrode body 121b is made of Ni, Al, Ti, and Au, which make ohmic contact with the i-GaN semiconductor layer 113 or a combination thereof.

The gate electrode 122 is formed on the inclined plane provided at one side of the npn stack structure. That is, the gate electrode 122 is formed on the inclined plane of the stack structure of the first to third semiconductor layers 116a, 116b, and 116c while interposing the gate dielectric layer 118. The gate electrode 122 is made of material such as Ti or Au.

In accordance with the present embodiment, the source electrodes are disposed on the npn stack structure of the source region side with high TDD and the drain electrodes are disposed on the channel forming stacks 113, 113a, 113b, 113c, 113d, 113e, and 113f of the drain region side with high TDD, so that an electric field can be prevented from being concentrated on a gate edge together with miniaturization of the transistor, and the TDD of the drift layer can be reduced, thereby providing a nitride-based transistor with low leakage and improved on-resistance.

An operation of the nitride-based transistor according to the present embodiment will be described.

When voltage equal to or more than forward threshold voltage is not applied to the gate electrode 122, that is, when the gate electrode is opened, an inverted layer is not formed on an inclined boundary surface of the second semiconductor layer 116b facing the gate electrode 122 in the npn stack structure and a channel is not formed between the third semiconductor layer 116c and the first semiconductor layer 116a, so that the transistor enters a non-activated or turn-off state in which no current flows. At this time, since the gate part and the channel part are separated from each other by the thick second high resistance pGaN buffer layer 115, it is possible to reduce leakage current between the source electrode and the drain electrode of the surface side, and a relatively wide depletion region formed on the boundary between the C-plane grown first to third i-GaN semiconductor layers 113a, 113c, and 113d and the first to third p type GaN semiconductor layers 113b, 113d, and 113f stably maintains a turn-off blocking electric field between the source electrode and the drain electrode.

When the voltage equal to or more than the forward threshold voltage is applied to the gate electrode 122, the inverted layer is formed on the inclined boundary surface of the second semiconductor layer 116b of the npn stack structure and the channel is formed between the third semiconductor layer 116c and the first semiconductor layer 116a, so that the transistor enters an activated or turn-on state in which current flows.

In the turn-on state of the transistor, electrons, which are supplied from the source electrodes 119a and 119b to the third semiconductor layer 116c of the npn stack structure, transfer toward the first semiconductor layer 116a through the channel around the inclined boundary surface of the second semiconductor layer 116b according to the voltage difference between the source electrodes 119a and 119b and the drain electrodes 121a and 121b, and transfer toward the drain electrodes 121a and 121b from the first semiconductor layer 116a through the channel formed in the channel forming stacks 113, 113a, 113b, 113c, 113d, 113e, and 113f. Through the transfer of the electrons, drain current flows through the drain electrodes 121a and 121b.

Figure 4:
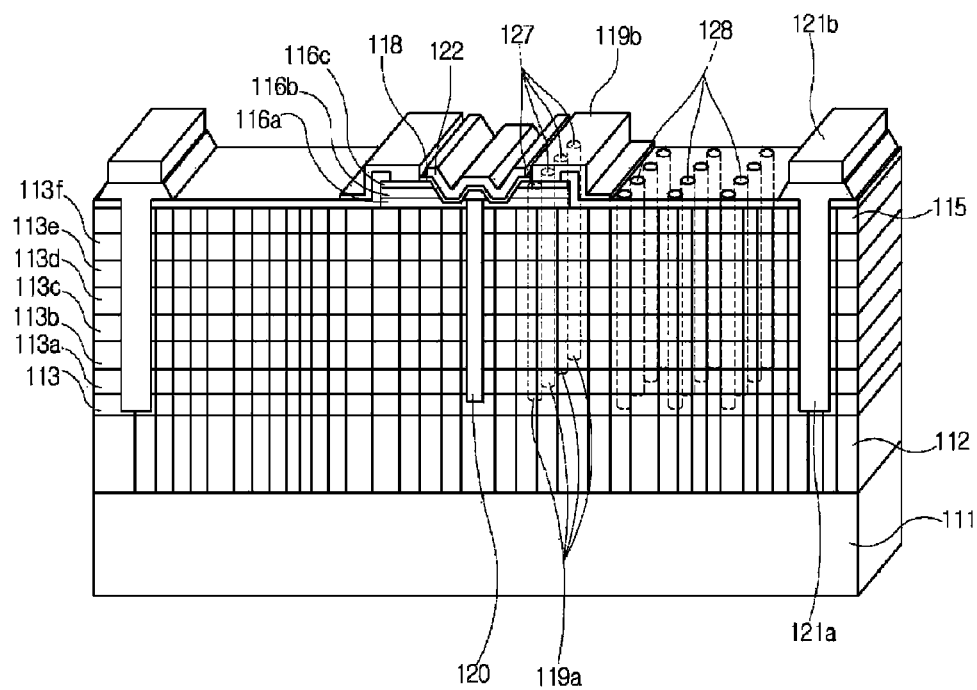
FIG. 4 is a cross-sectional view of a nitride-based transistor in accordance with yet another embodiment of the present invention.

FIG. 4 is a cross-sectional view of a nitride-based transistor in accordance with yet another embodiment of the present invention.

Referring to FIG. 4, the nitride-based transistor includes a substrate 111, a first high resistance GaN buffer layer 112, channel forming stacks 113, 113a, 113b, 113c, 113d, 113e, and 113f, a second high resistance GaN buffer layer 115, a first semiconductor layer 116a, a second semiconductor layer 116b, a third semiconductor layer 116c, an activation hole 117, a gate dielectric layer 118, source electrodes 119a and 119b, drain electrodes 121a and 121b, and a gate electrode 122.

Since the nitride-based transistor of FIG. 4 is approximately the same as the nitride-based transistor of FIG. 3 except that there is no nucleation layer for causing TDD concentration, a description thereof will be omitted in order to avoid redundancy.

In the nitride-based transistor of FIG. 4, it is not possible to achieve an effect due to TDD concentration, but a fabrication process is simplified as compared with the case of FIG. 3.

Figure 5:
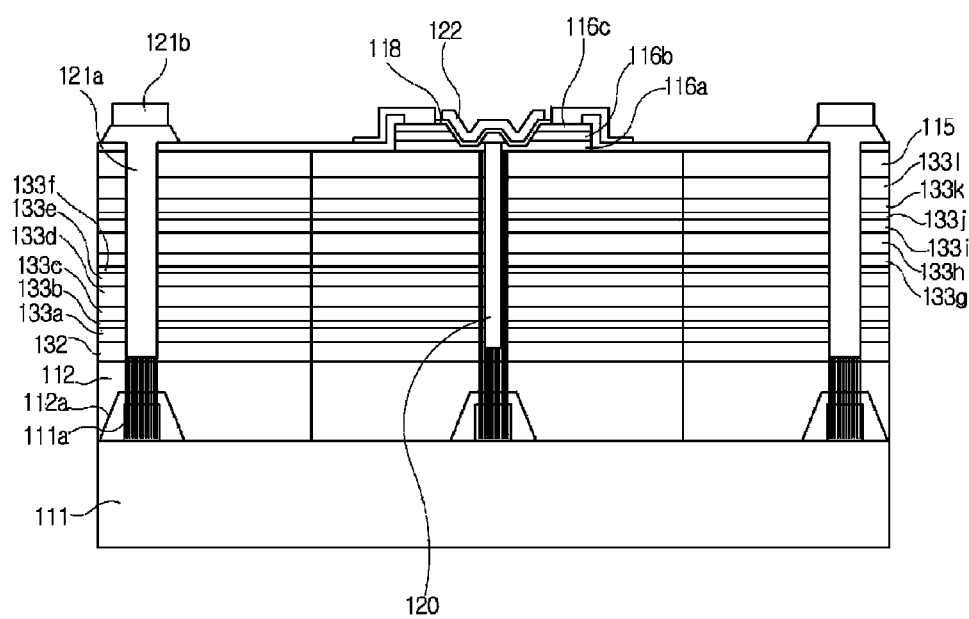
FIG. 5 is a cross-sectional view of a nitride-based transistor in accordance with still another embodiment of the present invention.

FIG. 5 is a cross-sectional view of a nitride-based transistor in accordance with still another embodiment of the present invention.

Referring to FIG. 5, the nitride-based transistor includes a substrate 111, a nucleation layer 112a, a first high resistance GaN buffer layer 112, a base p type GaN semiconductor layer 132, channel forming stacks 133a to 133l, a second high resistance GaN buffer layer 115, a first semiconductor layer 116a, a second semiconductor layer 116b, a third semiconductor layer 116c, an activation hole 117, a gate dielectric layer 118, source electrodes 119a and 119b, drain electrodes 121a and 121b, and a gate electrode 122.

Since the nitride-based transistor of the present embodiment is similar to the nitride-based transistor of FIG. 1 and/or FIG. 3 except for the channel forming stacks 133a to 133l, a description thereof will be partially omitted in order to avoid redundancy.

The substrate 111 may include a growth substrate such as sapphire substrate, an AlN substrate, a GaN substrate, a SiC substrate, or a Si substrate, and is not specially limited to any substrate if a nitride-based semiconductor can be grown on the substrate. In the following description, the substrate 111 is assumed to be a c-plane (0001) sapphire substrate for the purpose of convenience.

The substrate 111 is provided on the upper surface thereof with a convex stripe pattern 111a. The cross-section of the pattern 111a may have a mesa structure. Due to such a substrate 111, in a stack structure of epitaxial growth layers on the substrate, threading dislocation (TD) is concentrated on a desired part, that is, the upper portion of the pattern 111a.

The nucleation layer 112a is a low temperature GaN layer epitaxially grown on the substrate 111 about the pattern 111a of the substrate 111.

The second high resistance GaN buffer layer 115 is for planarization of the epitaxially growth layers on the substrate 111 and preventing electrons from escaping from an upper multi-2DEG channel layer (a drift layer). The first and second high resistance GaN buffer layers 112 and 115 contain electron-trapping impurity, such as Fe or C, which is doped with the concentration of about $5\times10^{17}/cm^2$ to about $1\times10^{19}/cm^2$, and has a thickness of about 0.01 μm or more and about 2 μm or less.

The channel forming stacks 133a to 133l include a first i-GaN semiconductor layer 133a, a first AlGaN semiconductor layer 133b, a second i-GaN semiconductor layer 133c, a first p type GaN semiconductor layer 133d, a third i-GaN semiconductor layer 133e, a second AlGaN semiconductor layer 133f, a fourth i-GaN semiconductor layer 133g, a second p type GaN semiconductor layer 133h, a fifth i-GaN semiconductor layer 133i, a third AlGaN semiconductor layer 133j, a sixth i-GaN semiconductor layer 133k, and a third p type GaN semiconductor layer 133l. The channel forming stacks 133a to 133l serve as a drift layer (a channel layer) that drifts electrons according to a voltage difference between the source electrodes 119a and 119b and the drain electrodes 121a and 121b.

The AlGaN semiconductor layers 133b, 133f, and 133j have an aluminum (Al) composition ratio of 10% to 100% and is formed to have a thickness of about 10 nm or more and about 50 nm or less.

The i-GaN semiconductor layer 133a, 133c, 133e, 133g, 133i, and 133k include a c-plane growth intrinsic GaN semiconductor and has a thickness of about 0.01 μm or more and about 1.0 μm or less.

The p type GaN semiconductor layers 133d, 133h, and 133l may be formed to have a p type by doping Mg or Zn, and may have a thickness of about 0.02 μm or more and about 2.0 μm or less, which is thicker than those of the i-GaN semiconductor layer 133a, 133c, 133e, 133g, 133i, and 133k.

When the i-GaN semiconductor layer 133a, 133c, 133e, 133g, 133i, and 133k are used, since continuous growth is simply performed from upper and lower layer materials and process control of impurity doping concentration and the like is not required, it is advantageous in that it is possible to simplify a fabrication process. When such an advantage is reduced or is not considered, the i-GaN semiconductor layer 133a, 133c, 133e, 133g, 133i, and 133k may be made of a binary system nitride-based semiconductor such as InN, a ternary system nitride-based semiconductor such as AlGaN or InGaN, or a quaternary system nitride-based semiconductor such as AlInGaN, in addition to the GaN semiconductor.

The first semiconductor layer 116a, the second semiconductor layer 116b, and the third semiconductor layer 116c form an npn stack structure for forming a switch region of the transistor, and a description thereof will be omitted in order to avoid redundancy because it is the same as the stack structures of FIG. 3 and FIG. 4

In accordance with the present embodiment, the source electrodes are disposed on the npn stack structure of the source region side with high TDD and the drain electrodes are disposed on the channel forming stacks 133a to 133l of the drain region side with high TDD, so that an electric field can be prevented from being concentrated on a gate edge together with miniaturization of the transistor, and the TDD of the drift layer can be reduced, thereby providing a nitride-based transistor with low leakage and improved on-resistance.

An operation of the nitride-based transistor according to the present embodiment will be described.

When voltage equal to or more than forward threshold voltage is not applied to the gate electrode 122, that is, when the gate electrode is opened, an inverted layer is not formed on an inclined boundary surface of the second semiconductor layer 116b facing the gate electrode 122 in the npn stack structure and a channel is not formed between the third semiconductor layer 116c and the first semiconductor layer 116a, so that the transistor enters a non-activated or turn-off state in which no current flows. At this time, since the gate part and the channel part are separated from each other by the thick second high resistance pGaN buffer layer 115, it is possible to reduce leakage current between the source electrode and the drain electrode of the surface side, and a relatively wide depletion region formed on the boundary between the C-plane grown second, fourth, and sixth i-GaN semiconductor layers 133c, 133g, and 133k and the first to third p type GaN semiconductor layers 133d, 133h, and 133l stably maintains a turn-off blocking electric field between the source electrode and the drain electrode.

When the voltage equal to or more than the forward threshold voltage is applied to the gate electrode 122, the inverted layer is formed on the inclined boundary surface of the second semiconductor layer 116b of the npn stack structure and the channel is formed between the third semiconductor layer 116c and the first semiconductor layer 116a, so that the transistor enters an activated or turn-on state in which current flows.

In the turn-on state of the transistor, electrons, which are supplied from the source electrodes 119a and 119b to the third semiconductor layer 116c of the npn stack structure, transfer toward the first semiconductor layer 116a through the channel around the inclined boundary surface of the second semiconductor layer 116b according to the voltage difference between the source electrodes 119a and 119b and the drain electrodes 121a and 121b, and transfer toward the drain electrodes 121a and 121b from the first semiconductor layer 116a through the channel formed in the channel forming stacks 133a to 133l. Through the transfer of the electrons, drain current flows through the drain electrodes 121a and 121b. At this time, the 2DEG channel formed by the first, third, and fifth i-GaN semiconductor layers 133a, 133e, and 133i and the first to third AlGaN semiconductor layers 133b, 133f, and 133j enables high electron transfer.

FIGS. 6a to 6k are process diagrams illustrating a method of fabricating the nitride-based transistor of FIG. 5.

In the present embodiment, for the purpose of convenience, the case of two unit electronic devices (nitride-based transistors) disposed in a face-to-face manner will be described as an example.

Figure 6A:
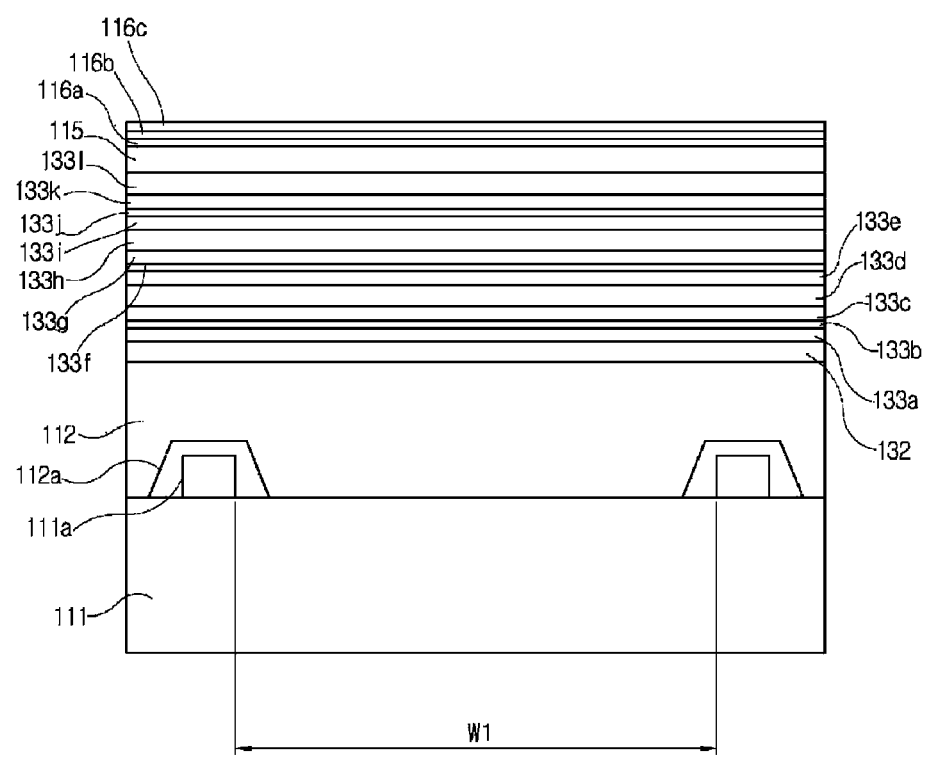
FIGS. 6a to 6k are process diagrams illustrating a method of fabricating the nitride-based transistor of FIG. 5.

As illustrated in FIG. 6a, the nucleation layer 112a, the first high resistance GaN buffer layer 112, the base p type GaN semiconductor layer 132, the channel forming stacks 133a to 133l, the second high resistance GaN buffer layer 115, a first n type GaN layer 116a0, a p type GaN layer 116b0, and a second n type GaN layer 116c0 are sequentially formed on the substrate 111.

The channel forming stacks 133a to 133l include the first i-GaN semiconductor layer 133a, the first AlGaN semiconductor layer 133b, the second i-GaN semiconductor layer 133c, the first p type GaN semiconductor layer 133d, the third i-GaN semiconductor layer 133e, the second AlGaN semiconductor layer 133f, the fourth i-GaN semiconductor layer 133g, the second p type GaN semiconductor layer 133h, the fifth i-GaN semiconductor layer 133i, the third AlGaN semiconductor layer 133j, the sixth i-GaN semiconductor layer 133k, and the third p type GaN semiconductor layer 133l. Each of sets 133a to 133d, 133e to 133h, and 133i to 133l including two i-GaN semiconductor layers, one AlGaN semiconductor layer, and one p type GaN semiconductor layer may cause a 2EDG channel layer and a wide depletion layer.

The channel forming stacks 133a to 133l serve as a drift layer (a channel layer) that drifts electrons according to a voltage difference between the source electrodes 119a and 119b and the drain electrodes 121a and 121b.

The substrate 111 may include a c-plane (0001) sapphire substrate. The substrate 111 is provided on one surface (the upper surface) thereof with the convex stripe pattern 111a. The cross-section of the pattern 111a may have a mesa structure. When the pattern 111a has a plurality of convex parts having a rod shape, an interval W1 between adjacent convex parts corresponds to the sum of lengths of cross-sections of one side of the two electronic devices. When such a substrate 111 is used, threading dislocation (TD) can be generated in a desired part (the upper portion of the pattern) in a stack structure of epitaxial growth layers on the substrate, and TD can be prevented from being generated in another part.

The nucleation layer 112a is formed on the pattern 111a of the substrate 111 to have a section with a mesa structure. The nucleation layer 112a may be formed as a low temperature GaN layer.

The first high resistance GaN buffer layer 112 planarizes the upper portion of the substrate 111 and prevents electrons from escaping from the multi-2DEG channel layer (the drift layer) of the upper side.

The first high resistance GaN buffer layer 112 may be formed through an epitaxial growth process using a MOCVD (Metal Organic Chemical Vapor Deposition) apparatus. The first high resistance GaN buffer layer 112 contains electron-trapping impurity, such as Fe or C, which is doped with the concentration of about $5\times10^{17}/cm^2$ to about $1\times10^{19}/cm^2$, and has a thickness of about 0.01 µm or more and about 2 µm or less.

The first high resistance GaN buffer layer 112 may also be formed through a Pendeo epitaxy process capable of obtaining a layer forming result from the nucleation layer 112a, which is similar to an epitaxial growth process including epitaxial lateral overgrowth (ELO), according to implementations.

The channel forming stacks 133a to 133l have a plurality of i-GaN/AlGaN/i-GaN/P-GaN stack structures. In the present embodiment, the channel forming stacks 133a to 133l include the first i-GaN semiconductor layer 133a, the first AlGaN semiconductor layer 133b, the second i-GaN semiconductor layer 133c, the first p type GaN semiconductor layer 133d, the third i-GaN semiconductor layer 133e, the second AlGaN semiconductor layer 133f, the fourth i-GaN semiconductor layer 133g, the second p type GaN semiconductor layer 133h, the fifth i-GaN semiconductor layer 133i, the third AlGaN semiconductor layer 133j, the sixth i-GaN semiconductor layer 133k, and the third p type GaN semiconductor layer 133l, which are sequentially grown on the first high resistance GaN buffer layer 112 by the MOCVD.

Each of the i-GaN layers 133a, 133c, 133e, 133g, 133i, and 133k is an intrinsic GaN layer and is formed to have a thickness of about 0.01 µm or more and about 0.2 µm or less. Each of the AlGaN layers 133b, 133f, and 133j has an aluminum (Al) composition ratio of 10% to 100% and is formed to have a thickness of about 10 nm or more and about 50 nm or less. Each of the p type GaN semiconductor layers 133d, 133h, and 133*l* may be formed to have a p type by doping Mg or Zn, and has a thickness of about 0.02 µm or more and about 2.0 µm or less, which is thicker than that of the i-GaN semiconductor layer.

Preferably, the entire thickness of the channel forming stacks 133*a* to 133*l* is about 0.01 µm to about 1 µm; however, the present invention is not limited thereto, and the entire thickness of the channel forming stacks 133*a* to 133*l* may be 3.0 µm or more.

The second high resistance GaN buffer layer 115 prevents electrons from escaping from an upper electron transfer channel, and contains electron-trapping impurity, such as Fe or C, which is doped with the concentration of about $5 \times 10^{17}/cm^2$ to about $1 \times 10^{19}/cm^2$.

The second high resistance GaN buffer layer 115 may be epitaxially grown on the third p type GaN semiconductor layer 133*l* by the MOCVD to have a thickness of about 0.01 µm or more and about 2 µm or less.

The first n type GaN layer 116*a*0, the p type GaN layer 116*b*0, and the second n type GaN layer 116*c*0 form a NPN transistor structure and are epitaxially grown on the second high resistance GaN buffer layer 115. For example, the first n type GaN layer 116*a*0 is formed on the second high resistance GaN buffer layer 115 to have a height of about 0.01 µm or more and about 0.5 µm or less, the p type GaN layer 116*b*0 is formed on the first n type GaN layer 116*a*0 to have a height of about 0.01 µm or more and about 1.0 µm or less, and the second n type GaN layer 116*c*0 is formed on the p type GaN layer 116*b*0 to have a height of about 0.01 µm or more and about 0.5 µm or less.

For example, the impurity concentration (Si concentration) of the first n type GaN layer 116*a*0 may be about $1 \times 10^{19}/cm^2$, the impurity concentration (Mg concentration) of the p type GaN layer 116*b*0 may be about $1.3 \times 10^{17}/cm^2$ to about $5 \times 10^{19}/cm^2$, and the impurity concentration (Si concentration) of the second n type GaN layer 116*c*0 may be about $1 \times 10^{19}/cm^2$.

In the stack structure of the aforementioned first high resistance GaN buffer layer 112, the base p type GaN semiconductor layer 132, the channel forming stacks 133*a* to 133*l*, the second high resistance GaN buffer layer 115, the first n type GaN layer 116*a*0, the p type GaN layer 116*b*0, and the second n type GaN layer 116*c*0, the threading dislocation (TD) is generated at the upper portion of the pattern 111*a* formed by a surface treatment of the substrate 111 and the generation of the TD in another region is attenuated.

Figure 6B:
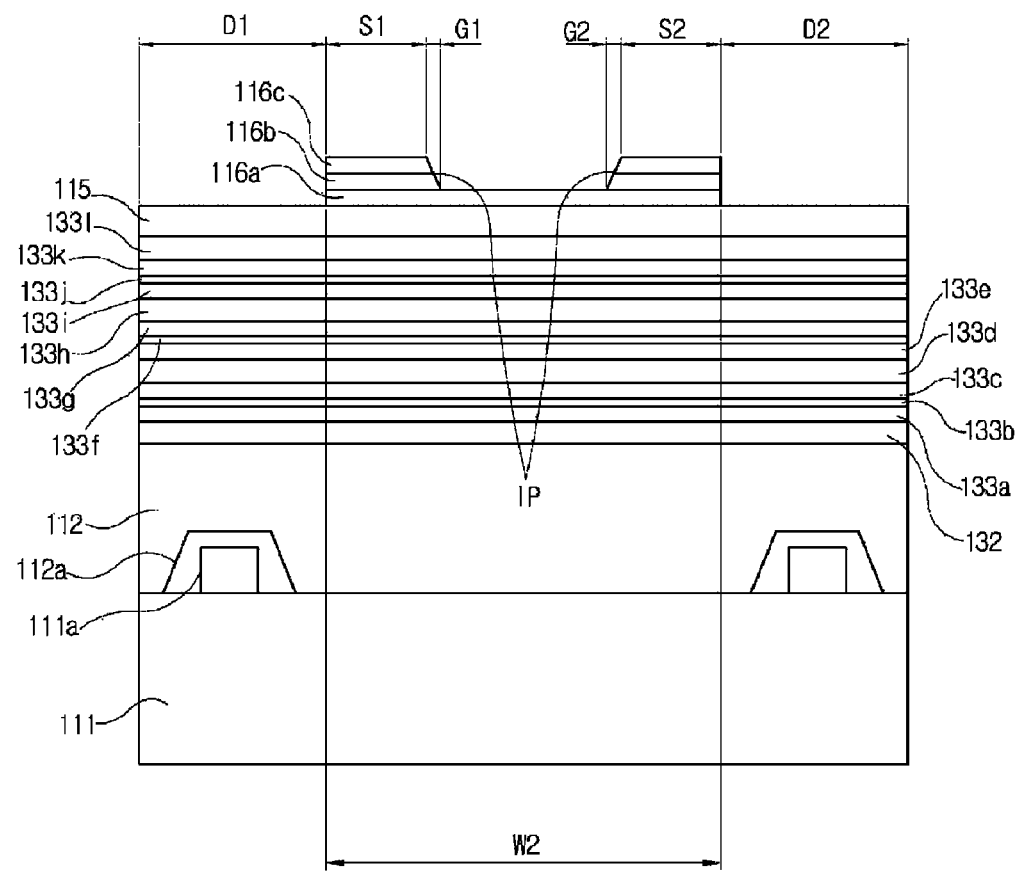

Next, as illustrated in FIG. 6*b*, the stack structure of the first n type GaN layer 116*a*0, the p type GaN layer 116*b*0, and the second n type GaN layer 116*c*0 is patterned to form the first conductive type first semiconductor layer 116*a*, the second conductive type second semiconductor layer 116*b*, and the first conductive type third semiconductor layer 116*c*. The first conductive type indicates an n type semiconductor and the second conductive type indicates a p type semiconductor.

The patterning may be performed through a dry etch process such as reactive ion etching (RIE). According to the patterning process, a stack structure, in which the first to third semiconductor layers 116*a*, 116*b*, and 116*c* are sequentially stacked, remains in source regions S1 and S2, and the first to third semiconductor layers 116*a*, 116*b*, and 116*c* are removed from drain regions D1 and D2, so that the second high resistance GaN buffer layer 115 is exposed. A part of the third semiconductor layer 116*c*, the second semiconductor layer 116*b*, and the first semiconductor layer 116*a* extending from the source regions S1 and S2 is removed from gate regions G1 and G2 to form an inclined plane IP, and the first semiconductor layer 116*a* is exposed. That is, one side of the stack structure of the first to third semiconductor layers 116*a*, 116*b*, and 116*c* disposed in the gate regions G1 and G2 is formed as the inclined plane IP.

In the present process, a second width W2 of a mesa valley structure M including the two source regions and the two gate regions of the two nitride-based transistors disposed in a face-to-face manner is smaller than a first width W1 between two adjacent convex parts of the pattern 111*a* of the substrate 111. The first width W1 is formed at an interval of about 10 µm to about 20 µm.

In the mesa valley structure M, an intermediate part has a trench extending in one direction and a cross-section perpendicular in one direction has a mesa structure. Such as mesa valley structure may correspond to a canal section shape, a M shape and the like.

The mesa valley structure M including the source regions and the gate regions is disposed in a region with relatively low threading dislocation (TD) density, or a region with no threading dislocation density between regions with relatively high threading dislocation density. Accordingly, in accordance with the present embodiment, it is possible to prevent maximum permission current from being reduced and leakage from being increased as the threading dislocation density is high in the horizontal HEMT, and to prevent on-resistance from being quickly increased in a high temperature operation.

Figure 6C:
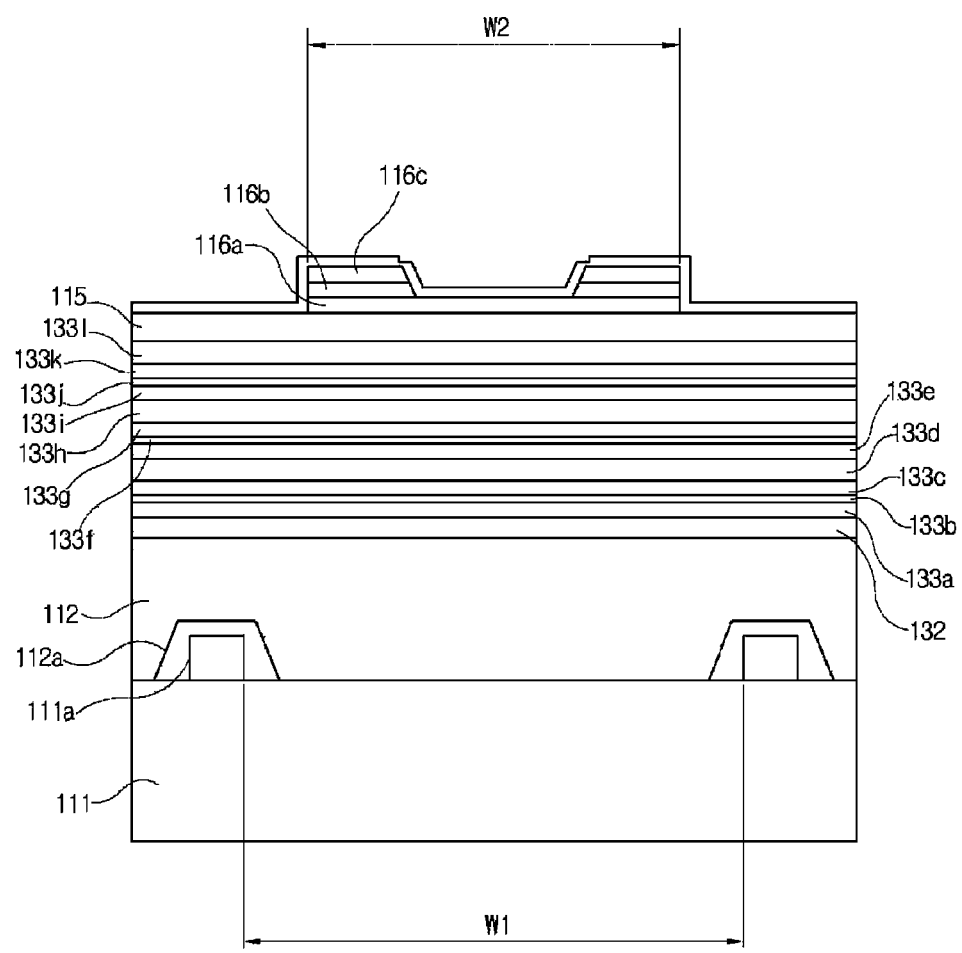

Next, as illustrated in FIG. 6*c*, the gate dielectric layer 118 is deposited on the trench region of the mesa valley structure. The gate dielectric layer 118 is formed to cover the two gate regions G1 and G2 including the inclined plane IP and a region in which a vertical conductive layer 120 between the gate regions G1 and G2 is to be formed. The gate dielectric layer 118 is for forming a MIS (Metal Insulator Semiconductor) HEMT structure, and may be formed to have a thickness of about 50 µm by using an $Al_2O_3$ insulating layer, an $Al_2O_3/HfO_2$ stack insulating layer, a silicon oxide layer, a silicon nitride layer and the like.

Figure 6D:
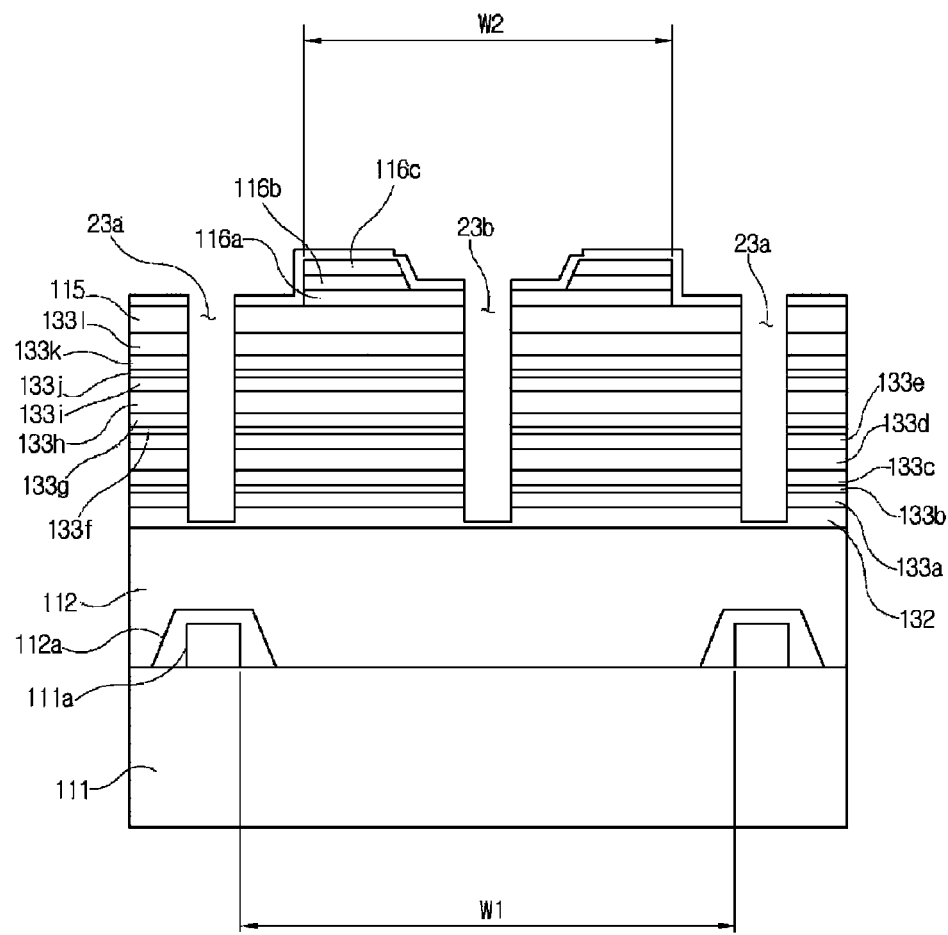

Next, as illustrated in FIG. 6*d*, a first contact hole 23*a* for forming a drain electrode and a second contact hole 23*b* for forming a vertical conductive layer are formed in the drain regions.

The first contact hole 23*a* is disposed in a region with relatively high threading dislocation density on the pattern 111*a* of the substrate 111. The second contact hole 23*b* is disposed in a region with relatively low threading dislocation density or with no threading dislocation density on a concave part between the patterns 111*a* of the substrate 111.

Depths of the first contact hole 23*a* and the second contact hole 23*b* are set to be disposed in an AlGaN/GaN heterojunction structure grown directly on the first high resistance GaN buffer layer 112.

Figure 6E:
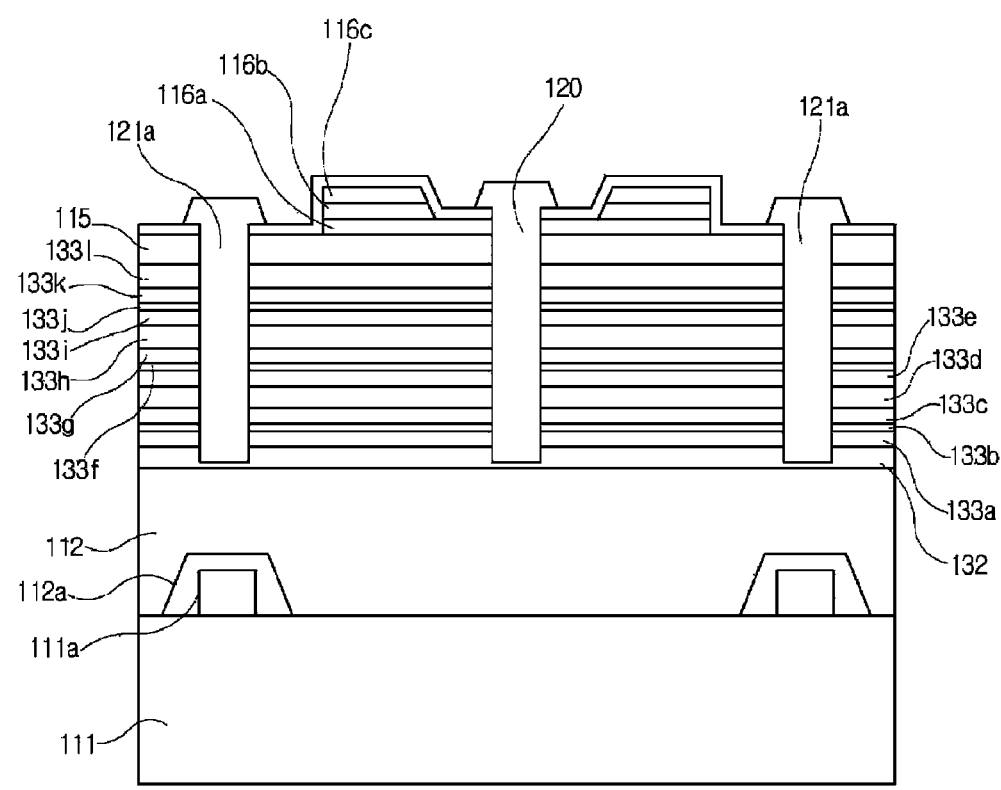

Next, as illustrated in FIG. 6*e*, the vertical conductive layer 120 and the drain electrode core 121*a* are formed through Si-doped n type GaN regrowth. The drain electrode core 121*a* is deposited on at least the bottom surface and inner surface of the first contact hole 23*a*. The drain electrode core 121*a* may be formed to fill the first contact hole 23*a* and protrude from the first contact hole 23*a* in a mesa shape.

Figure 6F:
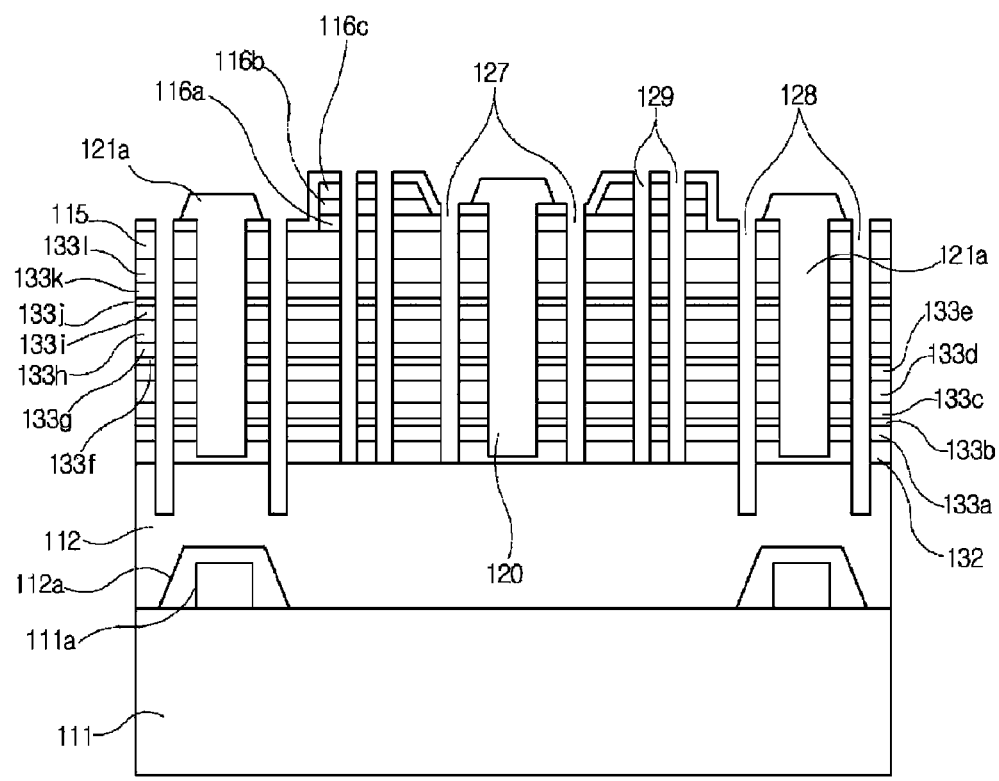

Next, as illustrated in FIG. 6*f*, through the aforementioned patterning process, the third semiconductor layer 116*c* and a half portion of the second semiconductor layer 116*b* are vertically removed in the source regions S1 and S2, so that a plurality of first activation holes 127 are formed. The first activation holes 127 are for activating Mg in the second semiconductor layer 116*b* epitaxially grown in a c axis direction and including p type GaN by performing a heat treatment process for the second semiconductor layer 116*b* at a predetermined temperature (about 925° C.), and serve as paths through which hydrogen is discharged from the second semiconductor layer 116*b* in the heat treatment process.

Next, as illustrated in FIG. 6*f*, through the aforementioned patterning process, a plurality of second activation holes 128, which reach the first high resistance GaN buffer layer 112 by passing through the base p type GaN semiconductor layer 132, the channel forming stacks 133*a* to 133*l*, and the second high resistance GaN buffer layer 115, are formed in a channel layer region between the vertical conductive layer 120 and the drain electrodes 121*a* and 121*b*. The second activation holes 128 are for activating Mg in the p type GaN semiconductor layers 132, 133*d*, 133*h*, and 133*l* epitaxially grown in the c axis direction and including the p type GaN by performing a heat treatment process for the p type GaN semiconductor layers 132, 133*d*, 133*h*, and 133*l* at a predetermined temperature (about 925° C.). Furthermore, core holes 129 may be formed simultaneously or sequentially in order to ensure a space for a source electrode core (119*a* of FIG. 5) in a subsequent process.

Figure 6G:
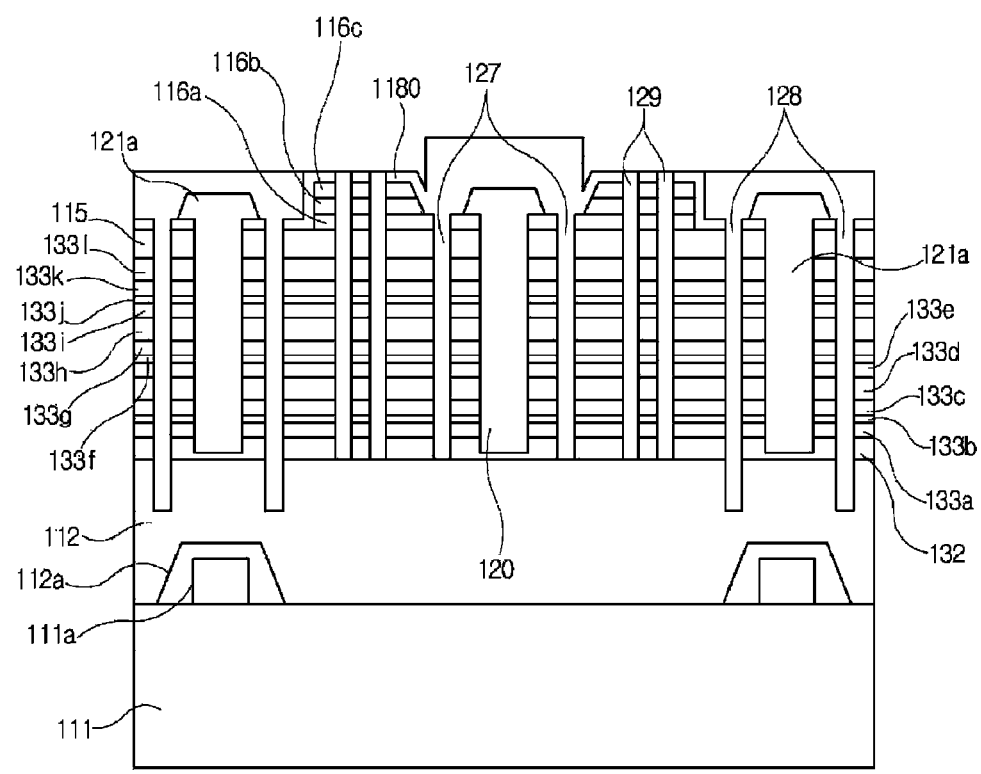

Next, as illustrated in FIG. 6*g*, an insulating layer ($SiO_2$) 1180 is deposited in order to fill the first and second activation holes 127 and 128.

Figure 6H:
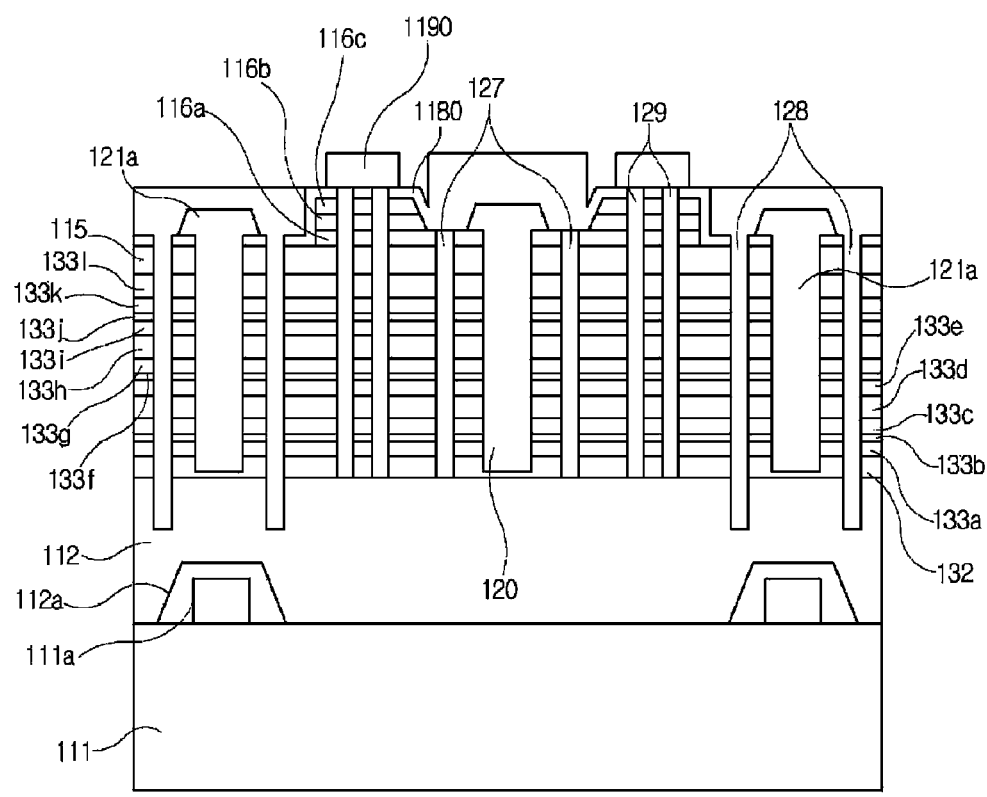

Next, as illustrated in FIG. 6*h*, a metal deposition process is performed in order to fill the core holes 129. The metal deposition process may include a plurality of times of photograph and etch processes, and is performed by depositing material including Ni, Al, Ti, and Au, which make ohmic contact, or a combination thereof. For example, the material includes Al/Ti, Au, Ni/Au and the like, which make low resistance ohmic contact. The core hole 129 filled with metal becomes the source electrode core 119*a*.

Figure 6I:
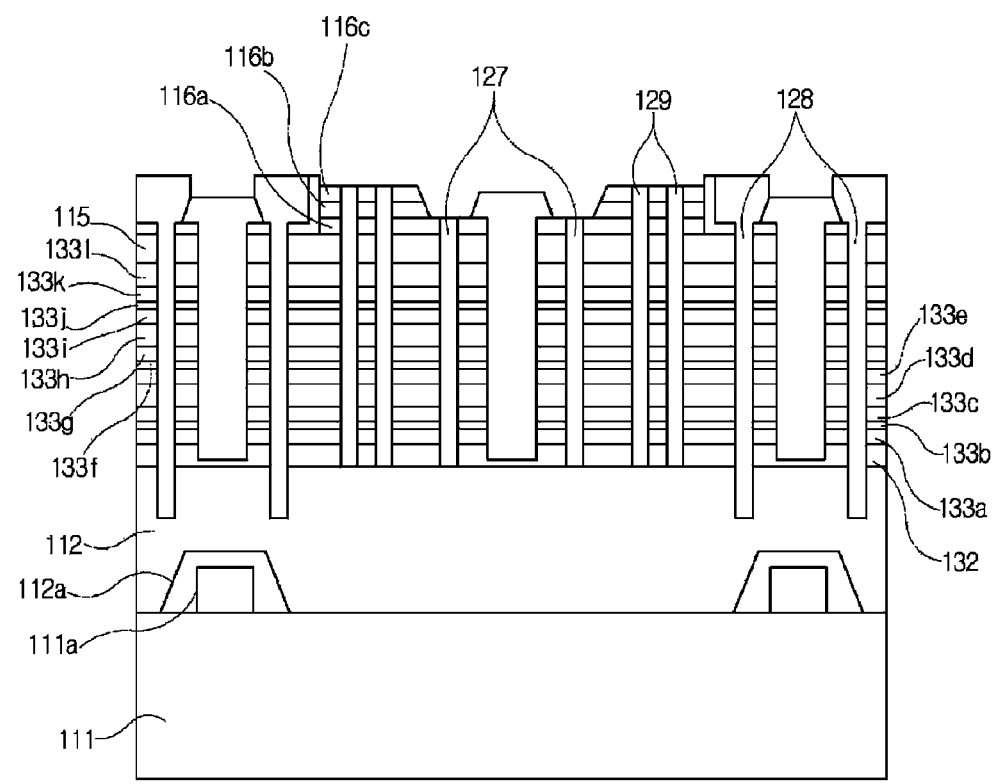

Next, as illustrated in FIG. 6*i*, the metal deposition metal and the insulating layer, which remain in parts in which a source electrode body (119*b* of FIG. 5) and a gate electrode (122 of FIG. 5) are formed, are removed.

Figure 6J:
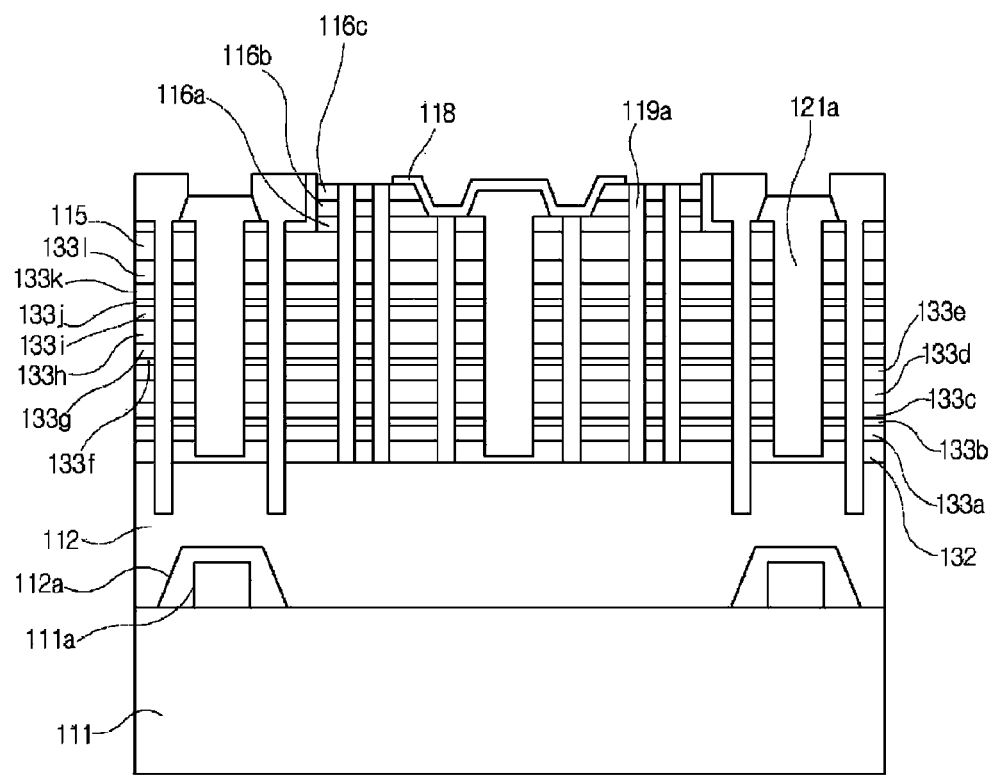

Then, as illustrated in FIG. 6*j*, the gate dielectric layer 118 under the gate electrode 122 is formed.

Figure 6K:
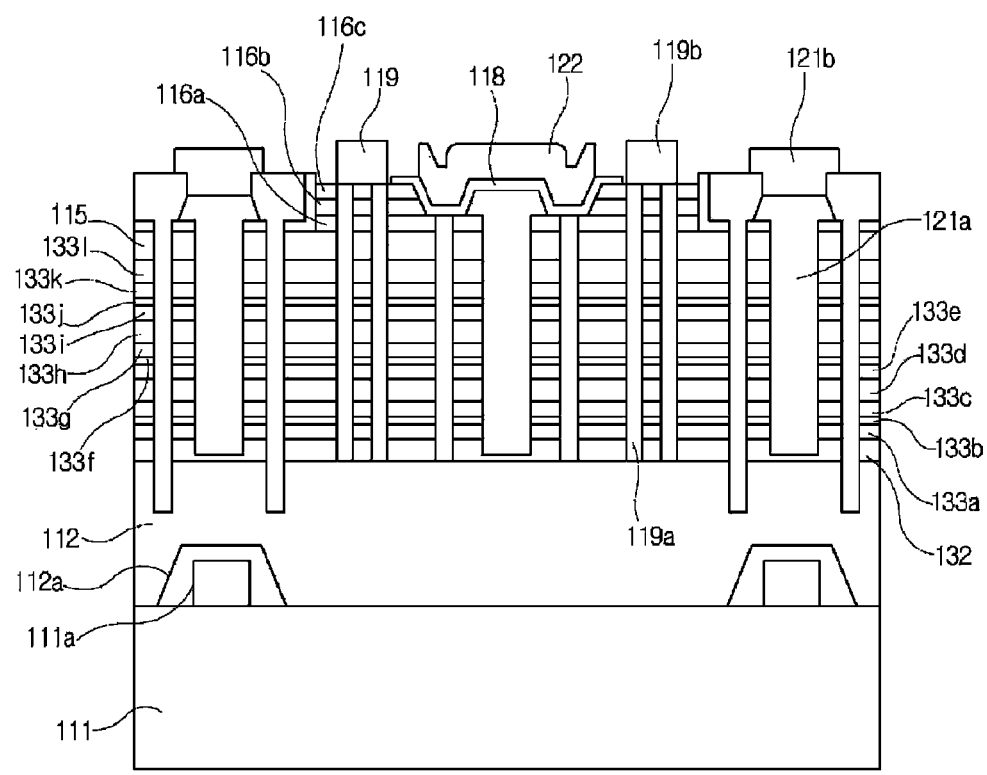

Last, as illustrated in FIG. 6*k*, metal is deposited to form the source electrode body 119*b*, the gate electrode 122, and the drain electrode body 121*b*. The gate electrode 122 is formed on the inclined plane of the stack structure of the first to third semiconductor layers 116*a* to 116*c* while interposing the gate dielectric layer 118. The metal deposition process may include a plurality of times of photograph and etch processes, and is performed by depositing material including Ni, Al, Ti, and Au, which make ohmic contact, or a combination thereof. For example, the material includes Al/Ti, Au, Ni/Au and the like, which make low resistance ohmic contact.

Figure 7:
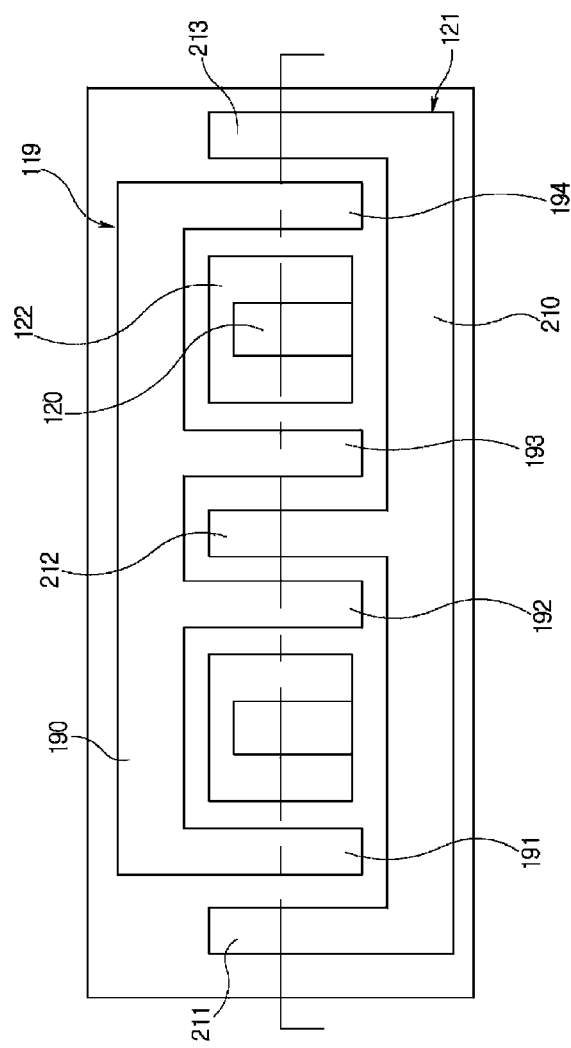
FIG. 7 is a plan view of a nitride-based transistor with high electron mobility.

FIG. 7 is a plan view of the nitride-based transistor with high electron mobility fabricated through the aforementioned process. As illustrated in FIG. 7, when the nitride-based transistor with high electron mobility is seen from the plane, the source electrode 119 has a first comb shape including a body 190 and first to fourth finger portions 191 to 194 extending from the body 190 in a first direction, and the drain electrode 121 has a second comb shape including a body 210 and first to third finger portions 211 to 213 extending from the body 210 in a second direction facing the first direction, wherein the first to fourth finger portions 191 to 194 of the source electrode 119 engage with the first to third finger portions 211 to 213 of the drain electrode 121.

In detail, the first finger portion 191 and the second finger portion 192 of the source electrode 119 are disposed between the first finger portion 211 and the second finger portion 212 of the drain electrode 121, and the third finger portion 193 and the fourth finger portion 194 of the source electrode 119 are disposed between the second finger portion 212 and the third finger portion 213 of the drain electrode 121.

Furthermore, as illustrated in FIG. 7, the vertical conductive layer 120 has a rod shape extending in the first direction between the first finger portion 191 and the second finger portion 192 of the source electrode 119. When seen from the plane, the gate electrode 122 is disposed to surround the periphery of the vertical conductive layer 120 while interposing the vertical conductive layer 120 between the first finger portion 191 and the second finger portion 192 of the source electrode 119.

An operation of the nitride-based transistor with high electron mobility fabricated in the present embodiment will be described.

When voltage equal to or more than forward threshold voltage is not applied to the gate electrode 122, that is, when the gate is opened, the inverted layer is not formed on the inclined boundary surface of the second semiconductor layer 116*b* facing the gate electrode 122 in the second semiconductor layer 116*b* of the npn stack structure and a channel is not formed between the third semiconductor layer 116*c* and the first semiconductor layer 116*a*, so that the transistor enters a non-activated or turn-off state in which no current flows.

When the voltage equal to or more than the forward threshold voltage is applied to the gate electrode 122, the inverted layer is formed on the inclined boundary surface of the second semiconductor layer 116*b* of the npn stack structure and the channel is formed between the third semiconductor layer 116*c* and the first semiconductor layer 116*a*, so that the transistor enters an activated or turn-on state in which current flows.

In the turn-on state of the transistor, electrons, which are supplied from the source electrode 119 to the third semiconductor layer 116*c* of the npn stack structure, transfer toward the first semiconductor layer 116*a* through the channel around the inclined boundary surface of the second semiconductor layer 116*b* according to the voltage difference between the source electrode 119 and the drain electrode 121, transfer the multi-channel layer through the vertical conductive layer 120 making low resistance ohmic contact with the first semiconductor layer 116*a*, and then transfer toward the drain electrode 121 through a plurality of 2DEG channels of the multi-channel layer with very low threading dislocation density or with no threading dislocation density. Through the transfer of the electrons, drain current flows through the drain electrode 121.

As described above, in accordance with the fabrication method of the nitride-based transistor with high electron mobility fabricated according to the present embodiment, the multi-channel layer is formed in a region with very low threading dislocation density or with no threading dislocation density, and the vertical conductive layer for connecting the switch region to the drift region is used, so that it is possible to provide a normally off nitride-based transistor in which on-resistance is low and the area or size of a device is small.

Particularly, in accordance with the fabrication method of the nitride-based transistor with high electron mobility fabricated according to the present embodiment, the multi-channel layer is used to distribute current flowing through the 2DEG channel, so that it is possible to attenuate stress of the AlGaN layer with the AlGaN/GaN heterojunction structure in a high current density operation, and the multi-channel layer is used to dispose the GaN layer on the AlGaN layer, and thus an interface level of the AlGaN/GaN heterojunction structure is lowered, that is, a permitted energy level existing in an interface is allowed to be within a forbidden band of a semiconductor, so that an energy barrier is prevented from being generated, thereby providing a normally off nitride-based transistor with high reliability.

Furthermore, in accordance with the fabrication method of the nitride-based transistor with high electron mobility fabricated according to the present embodiment, through a junction of the i-GaN semiconductor layer (an intrinsic semiconductor) and the p type GaN semiconductor layer stacked on the i-GaN semiconductor layer and having a thicker thickness, a fixed turn-off blocking electric field is formed in the channel between the source electrode and the drain electrode, so that it is possible to effectively prevent leakage current and to achieve high breakdown voltage.

In the aforementioned embodiments, the switch region of the transistor is formed in the npn stack structure; however, the present is not limited thereto, and the switch region may be formed in the pnp stack structure. In this case, in the nitride-based transistors of the aforementioned embodiments, the source electrode and the drain electrode are used by changing the roles of the source electrode and the drain electrode. It is of course that there may be a change in voltage applied to the gate electrode in order to control the operation of the transistor.

While the present invention has been described with respect to the specific embodiments, it will be apparent to those skilled in the art that various changes and modifications may be made without departing from the spirit and scope of the invention as defined in the following claims.

What is claimed is:

1. A normally off nitride-based transistor, comprising:
    a source electrode and a drain electrode;
    a channel layer comprising a charge transfer path between the source electrode and the drain electrode;
    a gate electrode configured to control charge transfer of the channel layer;
    a channel-forming stack comprising a junction structure of a first conductivity-type nitride semiconductor layer and an intrinsic nitride semiconductor layer configured to generate a fixed turn-off blocking electric field in a channel;
    a switch semiconductor layer disposed in a first region on the channel forming stack;
    a gate dielectric layer and a gate electrode disposed in a second region on the switch semiconductor layer;
    a source electrode disposed in a third region on the switch semiconductor layer; and
    a drain electrode disposed in a fourth region on the channel forming stack,
    wherein:
    the channel layer comprises a junction structure of a first conductivity-type nitride semiconductor layer and an intrinsic nitride semiconductor layer such that a fixed turn-off blocking electric field is to be generated in the channel layer between the source electrode and the drain electrode in a turn-off state;
    the intrinsic nitride semiconductor layer comprises an intrinsic GaN semiconductor layer, and the first conductivity-type nitride semiconductor layer comprises a p-type GaN semiconductor layer disposed on the intrinsic GaN semiconductor layer;
    the switch semiconductor layer comprises:
        a first conductivity-type first semiconductor layer disposed on the channel forming stack;
        a second conductivity-type second semiconductor layer disposed on the first semiconductor layer; and
        a first conductivity-type third semiconductor layer disposed on the second semiconductor layer; and
    an inclined plane is disposed from the third semiconductor layer to the first semiconductor layer.

2. The normally off nitride-based transistor according to claim 1, wherein a nucleation layer lower regions of the source electrode and the drain electrode.

3. A normally off nitride-based transistor, comprising:
    a channel forming stack comprising a junction structure of a first conductivity-type nitride semiconductor layer and an intrinsic nitride semiconductor layer configured to generate a fixed turn-off blocking electric field in a channel;
    a switch semiconductor layer disposed in a first region on the channel forming stack;
    a gate dielectric layer and a gate electrode disposed in a second region on the switch semiconductor layer;
    a source electrode disposed in a third region on the switch semiconductor layer; and
    a drain electrode disposed in a fourth region on the channel forming stack,
    wherein the switch semiconductor layer comprises:
        a first conductivity-type first semiconductor layer disposed on the channel forming stack;
        a second conductivity-type second semiconductor layer disposed on the first semiconductor layer; and
        a first conductivity-type third semiconductor layer disposed on the second semiconductor layer,
    wherein an inclined plane is disposed from the third semiconductor layer to the first semiconductor layer.

4. The normally off nitride-based transistor according to claim 3, further comprising a vertical conductive layer disposed in a lateral region, in which the inclined plane is low, of the gate electrode.

5. The normally off nitride-based transistor according to claim 3, further comprising an activation hole disposed in the switch semiconductor layer or the channel forming stack comprising no switch semiconductor layer.

6. The normally off nitride-based transistor according to claim 3, wherein:
    the intrinsic nitride semiconductor layer comprises an intrinsic GaN semiconductor layer;
    the first conductivity-type nitride semiconductor layer comprises a p type GaN semiconductor layer disposed on the intrinsic GaN semiconductor layer; and
    the channel forming stack comprises at least one of the intrinsic GaN semiconductor layer; and a structure of the p type GaN semiconductor layer disposed on the intrinsic GaN semiconductor layer.

7. The normally off nitride-based transistor according to claim 3, wherein the channel forming stack is a structure for forming a 2DEG channel and comprises:
    an i-GaN semiconductor layer;
    an AlGaN semiconductor layer stacked over the i-GaN semiconductor layer;
    wherein the channel forming stack comprises at least one of the i-GaN semiconductor layer and a structure of the AlGaN semiconductor layer disposed on the i-GaN semiconductor layer.

8. The normally off nitride-based transistor according to claim 3, further comprising:
    a nucleation layer disposed under the channel forming stack; and
    a nitride-based semiconductor buffer layer disposed on the nucleation layer,
    wherein a threading dislocation (TD) density of a fifth region, in which the nucleation layer is not formed in the buffer layer, is relatively low.

9. The normally off nitride-based transistor according to claim 8, further comprising an activation hole disposed in the switch semiconductor layer or the channel forming stack comprising no switch semiconductor layer.

10. The normally off nitride-based transistor according to claim 8, wherein:
   the intrinsic nitride semiconductor layer comprises an intrinsic GaN semiconductor layer;
   the first conductivity-type nitride semiconductor layer comprises a p type GaN semiconductor layer disposed on the intrinsic GaN semiconductor layer; and
   the channel forming stack comprises at least one of the intrinsic GaN semiconductor layer; and a structure of the p type GaN semiconductor layer disposed on the intrinsic GaN semiconductor layer.

11. The normally off nitride-based transistor according to claim 8, wherein the channel forming stack is a structure for forming a 2DEG channel and comprises:
   an i-GaN semiconductor layer;
   an AlGaN semiconductor layer stacked over the i-GaN semiconductor layer;
   wherein the channel forming stack comprises at least one of the i-GaN semiconductor layer and a structure of the AlGaN semiconductor layer disposed on the i-GaN semiconductor layer.

12. A normally off nitride-based transistor, comprising:
   a channel forming stack comprising a junction structure of a first conductivity-type nitride semiconductor layer and an intrinsic nitride semiconductor layer configured to generate a fixed turn-off blocking electric field in a channel;
   a switch semiconductor layer disposed in a first region on the channel forming stack;
   a gate dielectric layer and a gate electrode disposed in a second region on the switch semiconductor layer;
   a source electrode disposed in a third region on the switch semiconductor layer; and
   a drain electrode disposed in a fourth region on the channel forming stack wherein the switch semiconductor layer comprises:
      a first conductivity-type nitride semiconductor layer disposed on the channel forming stack;
      an intrinsic nitride semiconductor layer disposed on the first conductivity-type nitride semiconductor layer;
      an aluminum nitride semiconductor layer disposed on the intrinsic nitride semiconductor layer,
   wherein a recess structure is disposed in the first conductivity-type nitride semiconductor layer and the intrinsic nitride semiconductor layer.

13. The normally off nitride-based transistor according to claim 12, further comprising an activation hole disposed in the switch semiconductor layer or the channel forming stack comprising no switch semiconductor layer.

14. The normally off nitride-based transistor according to claim 12, wherein:
   the intrinsic nitride semiconductor layer comprises an intrinsic GaN semiconductor layer;
   the first conductivity-type nitride semiconductor layer comprises a p type GaN semiconductor layer disposed on the intrinsic GaN semiconductor layer; and
   the channel forming stack comprises at least one of the intrinsic GaN semiconductor layer; and a structure of the p type GaN semiconductor layer disposed on the intrinsic GaN semiconductor layer.

15. The normally off nitride-based transistor according to claim 12, wherein the channel forming stack is a structure for forming a 2DEG channel and comprises:
   an i-GaN semiconductor layer;
   an AlGaN semiconductor layer stacked over the i-GaN semiconductor layer;
   wherein the channel forming stack comprises at least one of the i-GaN semiconductor layer and a structure of the AlGaN semiconductor layer disposed on the i-GaN semiconductor layer.

* * * * *